United States Patent [19]

Fujishima et al.

[11] Patent Number: 5,267,214
[45] Date of Patent: Nov. 30, 1993

[54] SHARED-SENSE AMPLIFIER CONTROL SIGNAL GENERATING CIRCUIT IN DYNAMIC TYPE SEMICONDUCTOR MEMORY DEVICE AND OPERATING METHOD THEREFOR

[75] Inventors: Kazuyasu Fujishima; Yoshio Matsuda; Kazutami Arimoto; Tsukasa Ooishi; Masaki Tsukude, all of Hyogo, Japan

[73] Assignee: Mitsubishi Denki Kabushiki Kaisha, Tokyo, Japan

[21] Appl. No.: 616,264

[22] Filed: Nov. 20, 1990

[30] Foreign Application Priority Data

Feb. 16, 1990 [JP] Japan ................... 2-36666

[51] Int. Cl.$^5$ ........................... G11C 11/34
[52] U.S. Cl. ................ 365/230.03; 365/230.06; 365/149; 365/208
[58] Field of Search ............. 365/230.03, 207, 208, 365/230.06, 149, 189.11

[56] References Cited

U.S. PATENT DOCUMENTS 4,241,425 12/1980 Cenker et al. .......... 365/230.03
4,351,034 9/1982 Eaton, Jr. et al. ........... 365/189
5,014,246 5/1991 Komatsu et al. .......... 365/230.06
5,016,224 5/1991 Tanaka et al. ............. 365/207

FOREIGN PATENT DOCUMENTS 57-100689 6/1982 Japan .
60-694 1/1985 Japan .

Primary Examiner—Eugene R. LaRoche
Assistant Examiner—Vu Le
Attorney, Agent, or Firm—Lowe, Price, LeBlanc & Becker

[57] ABSTRACT

A dynamic random access memory amplifier arrangement includes a sense amplifier band shared between two different memory blocks. In this memory, only sense amplifiers related to a selected memory block are activated. The memory comprises a circuit for boosting a control signal voltage to a switching unit for connecting the selected memory block to the sense amplifiers up to a level higher than a power supply voltage Vcc during the activation of the sense amplifiers, and a circuit for separating a memory block paired with the selected memory block from the activated sense amplifiers during the sensing operation. The memory further comprises a circuit for generating a control signal of the power supply voltage Vcc and connecting all the memory blocks to the corresponding sense amplifiers in a stand-by state wherein a row address strobe signal is inactive. With this arrangement, a highly reliable memory consuming less power can be achieved which ensures data writing and/or rewriting at a full Vcc level.

9 Claims, 15 Drawing Sheets

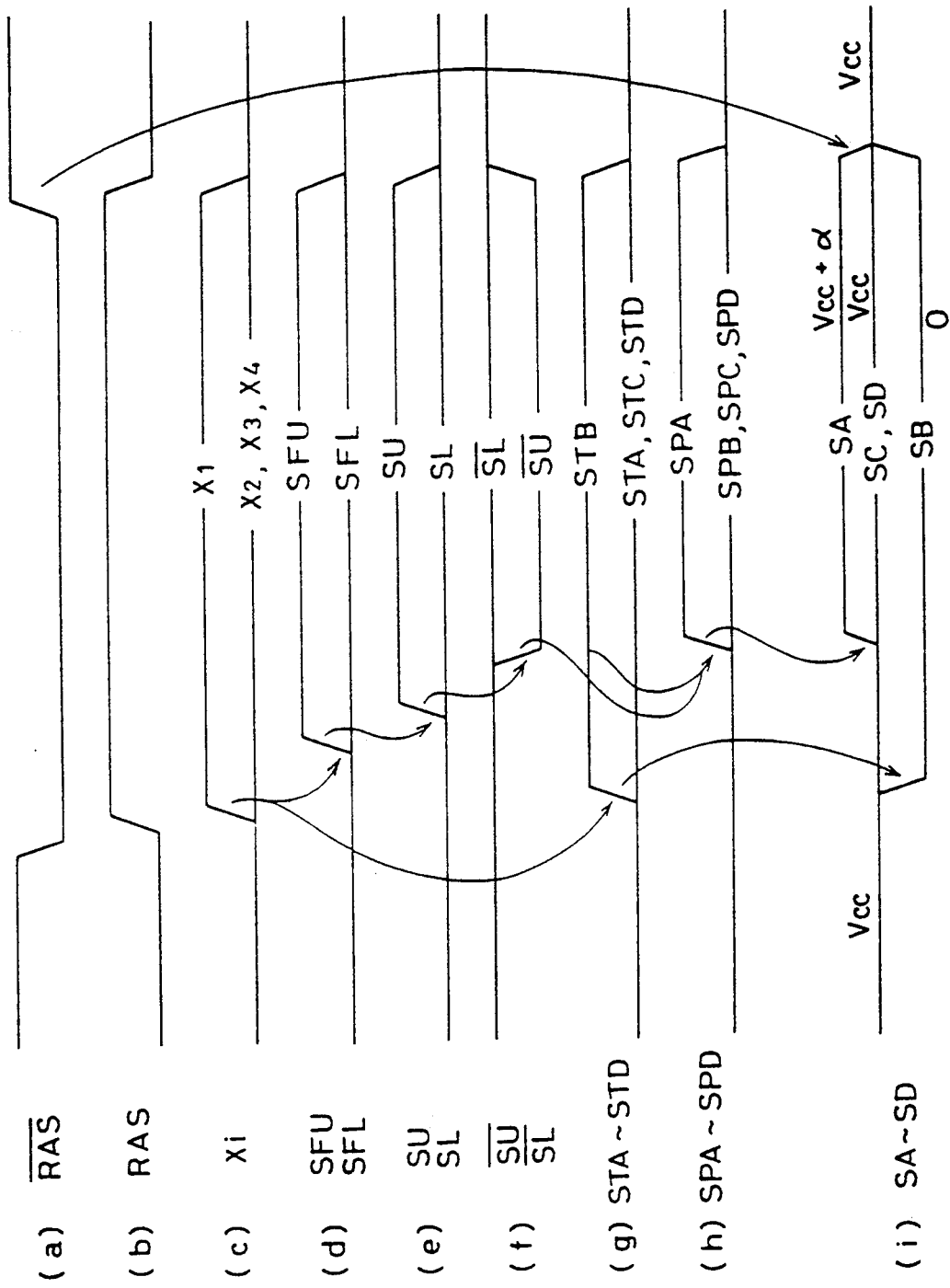

ly increased. Therefore, even if the storage capacitance of a memory cell is small, a sufficient signal voltage can be obtained from the memory cell on a bit line.

SHARED-SENSE AMPLIFIER CONTROL SIGNAL GENERATING CIRCUIT IN DYNAMIC TYPE SEMICONDUCTOR MEMORY DEVICE AND OPERATING METHOD THEREFOR

BACKGROUND OF THE INVENTION

1. Field of the Invention

The present invention relates generally to dynamic type semiconductor memory devices, particularly to a semiconductor memory device having a shared sense amplifier arrangement wherein one sense amplifier is shared between the columns in two different memory blocks. More specifically, the present invention relates to circuit for generating a control signal to connect shared sense amplifiers to the corresponding columns.

2. Description of the Background Art

In a dynamic type semiconductor memory device (DRAM), information is stored in the form of electric charges in a capacitor. In reading data, the signal charges stored in the capacitor are transferred onto a bit line (data line). A small change in potential is produced on the bit line depending on the existence of the signal charges transferred onto the bit line, and the potential change is sensed and amplified by a differential operation type sense amplifier to read the information.

As a semiconductor memory device is highly integrated to reduce the size of a memory cell, the inevitable is a tendency of reduction in storage capacitance of a memory capacitor. Various improvements have been made for obtaining sufficient difference in input potentials (signal voltage) for a sense amplifier against the reduced size of the memory cell followed by the reduced storage capacitance.

One of such conventional countermeasures is U.S. Pat. No. 4, 351,034 issued Sep. 21, 1982, entitled "Folded Bit Line-Shared Sense Amplifier" by S. S. Eaton et al. and assigned to Inmos Corporation. This U.S. patent employs the shared sense amplifier arrangement wherein a memory cell array is divided into two blocks and sense amplifiers are disposed and shared between the two blocks. During the sensing operation, only the columns in one block are connected to the sense amplifiers and the columns of the other block are subsequently connected to the sense amplifiers after the sensing operation.

With the above-described arrangement, since the number of memory cells connected to one bit line can be reduced, parasitic capacitance of a bit line associated with the memory cells is reduced, so that even if the same amount of signal charges are transferred onto the bit line, potential change on the bit line can be almost twice that in a non-divided cell array. This is possible because the potential on the bit line varies in proportion to a ratio Cs/Cb of a memory cell capacitance Cs to a bit line capacitance Cb.

The development of the above-described shared sense amplifier arrangement is a multi-divisional bit line arrangement as disclosed in Japanese Patent Laying Open No. 57-100689. In the multi-divisional bit line arrangement, a memory cell array is divided into four or more blocks and the number of sense amplifiers is increased in order to reduce the number of memory cells connected to one bit line. In this case, one sense amplifier is shared between two bit line pairs included in different memory cell blocks. It is structured such that in the operation, while a cell block including selected memory cells is connected to sense amplifiers to be subjected to sensing operation, sense amplifiers connected to memory cell arrays without the selected memory cells is not activated to be placed in a standby state. This arrangement enables not only the enhancement in a read signal voltage from a memory cell but also the reduction of power consumption associated with charge/discharge of bit lines during the operation of the sense amplifiers because the sense amplifiers are selectively activated. Therefore this arrangement will be widely used in large capacity DRAMs of 4 megabits and 16 megabits.

FIG. 1 is a diagram showing an arrangement of a modified conventional DRAM chip employing the multi-divisional bit line arrangement. FIG. 1 shows an example of an arrangement of 256 KW (kilo word) by one bit. Referring to FIG. 1, a semiconductor chip 100 comprises an address input terminal 52 for receiving a row address RA0–RA8 and a column address CA0–CA8 applied in a time-division multiplexing manner, an input terminal 51 for receiving a row address strobe signal $\overline{RAS}$ for supplying timing of strobing the row address applied in the time-division multiplexing manner into the device, an input terminal 53 for receiving a column address strobe signal $\overline{CAS}$ for supplying timing of strobing the column address into the device, an input terminal 54 for receiving a read/write control signal R/W for defining reading/writing operations of the memory device, a data input terminal 55 for receiving input data $D_{IN}$, and a data output terminal 56 for supplying output data $D_{OUT}$. The semiconductor chip 100 is further provided with a terminal for supplying a power supply voltage Vcc which becomes a reference voltage and a terminal for supplying a ground potential Vss, though they are not shown.

In FIG. 1, the semiconductor memory device includes a memory cell array divided into four memory blocks 1a, 1b, 1c and 1d each having one or more rows of memory cells and sense amplifier bands 2a and 2b shared between two blocks. The sense amplifier band 2a is shared between the memory cell blocks 1a and 1b and the sense amplifier band 2b is shared between the memory cell blocks 1c and 1d. The sense amplifier bands 2a and 2b include sense amplifiers provided corresponding to the respective columns (bit line pairs) of the corresponding block for differentially amplifying signal potentials on the corresponding columns in response to control signals SFU, SU, $\overline{SU}$ and SFL, SL and $\overline{SL}$, respectively.

Row decoders 3, word drivers 4, a row address buffer 5, a row predecoder 13, a φx (word line drive master signal) generating circuit 7 and a φx subdecoder 12 are provided for selecting one row (one word line) of the memory cell array in response to external address signals. The row address buffer 5 receives 9-bit address signals A0–A8 applied to the address input terminals 52 and generates complementary internal row address signals RA0, $\overline{RA0}$–RA8 and $\overline{RA8}$ in response to internal control signals from a RAS buffer 6.

The row predecoder 13 decodes the internal row address signals RA2, $\overline{RA2}$–RA7 and $\overline{RA7}$ from the row address buffer circuit 5 and generates a total of 12 predecoded signals X1–X4 (generically represented as Xi), X5–X8 (generically represented as Xj) and X9–X12 (generically represented as Xk). While the correspondence of the predecoded signals X1–X12 to the memory cell blocks is arbitrary, for the purpose of the simplicity of description, it is assumed in the following that the predecoded signals Xi (X1-X4) are used as signals for designating memory cell blocks.

FIG. 2 schematically shows arrangements of the address buffer 5 for generating the internal row address signals RA2 and RA3, and $\overline{RA2}$ and $\overline{RA3}$ from the external address signals A2 and A3 and the row predecoder 13 for generating the predecoded signals Xi. In FIG. 2, the row address buffer 5 includes a buffer circuit 5a for generating the internal row address signals RA2 and $\overline{RA2}$ complementary with each other in response to the external address signal A2 and a buffer circuit 5b for generating the internal row address signals RA3 and $\overline{RA3}$ complementary with each other in response to the external address signal A3.

The row predecoder 13 includes a decoder circuit 13a for generating the predecoded signal X1 in response to the internal row address signals $\overline{RA2}$ and RA3, a decoder circuit 13b for generating the predecoded signal X2 in response to the internal row address signals RA3, a decoder circuit 13c for generating the predecoded signal X3 in response to the internal row address signals RA2 and $\overline{RA3}$, and a decoder circuit 13d for generating the predecoded signal X4 in response to the internal row address signals $\overline{RA2}$ and $\overline{RA3}$. Each of the predecoder circuits 13a to 13d has the same circuit arrangement. When the predecoded signals X1 to X4 are used as block designating signals, only one of the predecoded signals X1 to X4 enters a selected state to be, for example, a "H" (logical high) level. Each of the predecoder circuits 13a to 13d is comprised of an AND gate or NAND gate. The circuits for generating the other predecoded signals Xj and Xk have the same arrangement.

Back to FIG. 1, the $\phi X$ generating circuit 7 generates a word line drive master signal $\phi x$ for driving a word line in response to the internal clock signals from the RAS buffer 6 and applies the same to the $\phi x$ subdecoder 12. The $\phi x$ subdecoder 12 generates word line subdecoded signals $\phi X1-\phi X4$ in response to the internal row address signals RA0, $\overline{RA0}$, RA1 and $\overline{RA1}$ and the word line driving signal $\phi x$ from the row address buffer 5 to generate word line sub-decoded signals $\phi x1$ to $\phi x4$ and applies the same to the word driver 4. Only one of the word line sub-decoded signals $\phi x1-\phi x4$ rises to the "H" level.

FIG. 3 is a schematic diagram of an arrangement of the $\phi x$ subdecoder. In FIG. 3, $\phi x$ subdecoder 12 includes subdecoding circuit 12a-12d. The subdecoding circuit 12a selectively passes the word line driving master signal $\phi x$ in response to the internal row address signals RA0 and $\overline{RA1}$ to generate the word line subdecoded signal $\phi xl$. The subdecoding circuit 12b selectively passes the word line driving master signal $\phi x$ in response to the internal row address signals RA0 and RA1 to generate the word line sub-decoded signal $\phi x2$. The subdecoding circuit 12c selectively passes the word line driving master signal $\phi x$ in response to the internal row address signals $\overline{RA0}$ and RA1 to generate the word line sub-decoded signal $\phi x3$. The subdecoding circuit 12d selectively passes the word line driving master signal $\phi x$ in response to the internal row address signals RA0 and RA1 to generate the word line sub-decoded signal $\phi x4$.

Back to FIG. 1, the row decoder 3 further decodes the predecoded signals Xi, Xj and Xk from the row predecoder 13 to generate decoded signals for selecting four word lines. The word driver 4 transmits the word line driving signal onto one word line in response to the decoded signals from the row decoder 3 and the word line subdecoded signal $\phi x1-\phi x4$ from the $\phi x$ subdecoder 12. FIG. 4 shows one example of a specific arrangement of the row decoder 3 and the word driver 4.

FIG. 4 shows a unit row decoder and an associated word driver as representatives. Referring to FIG. 4, a unit row decoder 30 includes a 3-input AND circuit for receiving 3-bit predecoded signals Xi, Xj and Xk and an inverter for inverting an output of the NAND circuit.

The NAND circuit includes a p channel insulated gate type field effect transistor (referred to as p MIS transistor hereinafter) PT1 and an n channel insulated gate type field effect transistor (referred to as n MIS transistor hereinafter) NT1 each having a gate for receiving the predecoded signal Xi, an n MIS transistor NT2 with a gate for receiving the predecoded signal Xj, an n MIS transistor NT3 with a gate for receiving the predecoded signal Xk and a p MIS transistor PT2 with a gate for receiving inverter output. The p MIS transistors PT1 and PT2 are provided in parallel with each other between a power supply voltage Vcc and a node N1. The n MIS transistors NT1, NT2 and NT3 are connected in series between the node N1 and a ground potential Vss.

The inverter includes a p MIS transistor PT3 and an n MIS transistor NT4 each having a gate for receiving an output of the NAND circuit. The p MIS transistor PT3 and the n MIS transistor NT4 are complementarily connected between the power supply potential Vcc and the ground potential Vss. The unit row decoder 30 outputs the output of the NAND circuit (potential at the node N1) and an output of the inverter (potential at a node N2), which are transmitted to four word driving circuits.

Four word driving circuits 4a, 4b, 4c and 4d are provided for one unit row decoder 30. The word driving circuit 4a includes an n MIS transistor NT5 for transmitting the potential of the node N2 of the unit row decoder 30, an n MIS transistor NT6 having a gate for receiving the transmitted potential from n MIS transistor NT5 to selectively transmit the word line subdecoded signal $\phi x1$ onto a word line WL1 and an n MIS transistor NT7 having a gate for receiving the potential at the node N1 of the unit row decoder 30 to selectively connect the word line WL1 to the ground potential. The transistor NT5 acts as a decoupling transistor for decoupling the gate of the transistor NT6 from the node N2.

While each of the word driving circuits 4b, 4c and 4d has the same circuit arrangement as that of the word driving circuit 4a, it differs from the circuit 4a in a name of the transmitted word line sub-decoded signal. More specifically, the word driving circuit 4b selectively transmits the word line sub-decoded signal $\phi x2$ onto a word line WL2 in response to the output of the unit row decoder 30. The word driving circuit 4c selectively transmits the word line sub-decoded signal $\phi x3$ onto a word line WL3 in response to the output of the unit row decoder 30. The word driving circuit 4d selectively transmits the word line sub-decoded signal $\phi x4$ onto a word line WL4 in response to the output of the unit row decoder 30.

In the unit row decoder 30, only when all the predecoded signals Xi, Xj and Xk are at the "H" level, the potential of the node N1 attains an "L" (a logical low) level and correspondingly the potential of the node N2 attains the "H" level. When the potential of the node N2 is at the "H", the n MIS transistor NT6 receives a signal of the "H" at its gate through the n MIS transistor NT5 and becomes conductive in each of the word driving circuits 4a, 4b, 4c and 4d. As a result, the word line sub-decoded signal $\phi x1$-$\phi x4$ are transmitted onto the word lines WL1-WL4, respectively. Only one of the word line sub-decoded signal $\phi x1$-x4 rises to the "H" level.

Accordingly, only one of the word lines WL1-WL4 is driven to the "H".

When at least one of the predecoded signals Xi, Xj and Xk is at the "L" level, the potential of the node N1 attains the "H" level (charged through the p MIS transistor PT2) and the potential of the node N2 attains the "L" level, so that the unit row decoder 30 enters a non-selection state.

Back to FIG. 1 again, the semiconductor memory device further comprises a column address buffer 14 for receiving the address signals from the address input terminals 52 to select four columns of the memory cell array and for generating internal column address signals CA0-CA8 and $\overline{CA0}$-$\overline{CA8}$, a column predecoder 15 for decoding the internal column address signals CA0-CA7 and from the column address buffer 14 to generate 16-bit predecoded signals Y1-Y4 (generically referred to as Yi hereinafter), Y5-Y8 (generically referred to as Yi hereinafter), Y9-Y12 (generically referred to as Yk hereinafter) and Y13-Y16 (generically referred to as Y hereinafter) and a column decoder 16 for generating a column selecting signal CS for selecting four columns in response to the column predecoded signals Yi, Yj, Yk and Yl. In response to an internal control signal generated from a CAS buffer 19 in response to the column address strobe signal $\overline{CAS}$, the column address buffer 14 strobes addresses applied to the address input terminals 52 to generate internal column address signals.

The column predecoder 15 has the same arrangement as that of the row predecoder 13 shown in FIG. 2.

FIG. 5 shows one example of the specific arrangement of the column decoder 16.

Referring to FIG. 5, the column decoder 16 comprises p MIS transistors PT10, PT11, PT12 and PT13 connected in parallel with each other between the power supply voltage Vcc and a node N10, n MIS transistors NT10, NT11, NT12 and NT13 connected in series between the node N10 and the ground potential Vss, and an inverter for inverting a potential of the node N10 and transmitting the inverted potential to a node N11. The inverter includes a p MIS transistor PT14 and an n MIS transistor NT14.

Each of the p MIS transistor PT10 and the n MIS transistor NT10 has a gate for receiving the column predecoded signal Yi. Each of the p MIS transistor PT11 and the n MIS transistor NT11 has a gate for receiving the column predecoded signal Yj. Each of the p MIS transistor PT12 and the n MIS transistor NT12 has a gate for receiving the column predecoded signal Yk. Each of the p MIS transistor PT10 and the n MIS transistor NT13 has a gate for receiving the column predecoded signal Yl. A column selecting signal CS is generated from the node N11. In the arrangement of the column decoder shown in FIG. 5, when all the column predecoded signals Yi, Yj, Yk and Yl are at the "H" level, the potential of the node N10 attains the "L", whereby the column selecting signal CS of the "H" is generated.

Back to FIG. 1 again, an I/O decoder 17 for selecting one of the four columns selected by the column decoder 16 is provided. The I/O decoder 17 decodes the internal row address signals RA8 and $\overline{RA8}$ from the row address buffer 17 and the internal column address signals $\overline{CA8}$ a from the column address buffer 14 and selects a pair of buses among four pairs of buses on I/O bus 40.

A read/write control circuit 18, a read/write buffer 20, an input buffer 21 and an output buffer 22 are provided in order to receive/transfer data between the one pair of buses selected by the I/O decoder 17 and the external devices. In response to a read/write control signal R/W applied through the input terminal 54 and an internal control signal (internal CAS signal) applied from the CAS buffer 19, the read/write buffer 20 generates a timing signal for defining data writing/reading and applies the same to the read/write control circuit 18. The read/write control circuit 18 connects the pair of buses selected by the I/O decoder 17 with the input buffer 21 or the output buffer 22 in response to the control signal from the read/write buffer 20.

The input buffer 21 receive input data $D_{IN}$ applied through the input terminal 55 to generate the corresponding internal data (ordinarily, complementary data pair). The output buffer 22 receives the internal data transferred from the read/write control circuit 18, converts the same into the corresponding output data $D_{OUT}$ and applies the converted data to the output terminal 56.

A shared sense amplifier control signal generating circuit 8 and a sense amplifier control circuit 23 are provided in order to selectively connect the sense amplifier bands 2a and 2b to the memory cell blocks to operate the sense amplifiers included therein. The shared sense amplifier control signal generating circuit 8, in response to the row predecoded signal Xi from the row predecoder 13, generates selective connection control signals (shared sense amplifier control signals) SA, SB, SC and SD for the sense amplifier bands 2a and 2b and the memory blocks 1a-1d. The shared sense amplifier control signal SA controls connection between the sense amplifier band 2a and the memory cell block 1a. The shared sense amplifier control signal SB controls connection between the sense amplifier band 2a and the memory cell block 1b. The shared sense amplifier control signal SC controls connection between the sense amplifier band 2b and the memory cell block 1c. The shared sense amplifier control signal SD controls connection between the sense amplifier band 2b and the memory cell block 1d.

The sense amplifier control circuit 23 generating a control signal for selectively activating the sense amplifiers includes an SF (sense fast) signal generating circuit 9 responsive to the word line driving master signal $\phi x$ from the $\phi x$ generating circuit 7 and the predecoded signal Xi from the row predecoder 13, for generating signals SFU (sense fast upper blocks) and SFL (sense fast lower blocks) for activating sense amplifier in either the sense amplifier band 2a or 2b, a first sense amplifier activating signal generating circuit 10 responsive to the control signal from the SF signal generating circuit 9 for generating first sense amplifier activating signals SU and SL, and a second sense amplifier activating signal generating circuit 11 responsive to the activating signals from the first sense amplifier activating signal generating circuit 10 for generating second sense amplifier activating signals $\overline{SU}$ and $\overline{SL}$. The control signal SFU is applied to the sense amplifiers included in the sense amplifier band 2a. The control signal SFL is transmitted to the sense amplifiers included in the sense amplifier band 2b. The first sense amplifier activating signals SU and SL activate the sense amplifiers comprising the n channel MIS transistors, which will be described later in detail. The second sense amplifier activating signals $\overline{SU}$ and $\overline{SL}$ activate the sense amplifiers comprising the p channel MIS transistors.

FIG. 6 shows one example of an specific arrangement of the SF signal generating circuit 9. Referring to FIG. 6, the SF signal generating circuit 9 has two circuit portions, a circuit for generating the control signal SFU and a circuit for generating the control signal SFL. Since these circuit portions have the same arrangement, FIG. 6 shows the circuit incorporated into one. Referring to FIG. 6, the SF signal generating circuit 9 includes a Sdelay circuit 60 for delaying the word line driving master signal $\phi x$ by a predetermined time period, an OR gate 61 receiving the row predecoded signals X1 and X2, and an AND gate 62 receiving outputs of the delay circuit 60 and the OR gate 61. The AND gate 62 generates the control signal SFU. When the OR gate 61 receives the row predecoded signals X3 and X4, the control signal SFL is generated from the AND gate 62.

As clearly seen from FIG. 6, when the block 1a or 1b includes the selected memory cells, the sense amplifiers included in the sense amplifier band 2a are activated. In addition, when the block 1c or 1d includes the selected memory cells, the sense amplifiers included in the sense amplifier band 2b are activated.

FIG. 7 shows one specific example of a circuit arrangement wherein the second sense amplifier activating signal $\overline{SU}$ ($\overline{SL}$) is generated in response to the first sense amplifier activating signal SU (SL). Referring to FIG. 7, the second sense amplifier activating signal generating circuit 11 includes a delay stage for delaying the first sense amplifier activating signal by a predetermined time period and a circuit portion for generating the second activating signal $\overline{SU}$ ($\overline{SL}$) in response to a delay activating signal delay from the delay stage and to the control signal RAS. The delay stage is comprised of even-numbered cascade-connected of CMOS inverters each including p MIS transistor PT20-PT22 and n MIS transistors NT20-NT22.

The circuit portion for generating the second activating signal includes a p MIS transistor PT23 and an n MIS transistor NT23 each having a gate for receiving the delay activating signal Sdelay, a p MIS transistor PT24 connected in parallel with the p MIS transistor PT23 and having a gate for receiving the control signal RAS, and an n MIS transistor NT24 connected in series between the p MIS transistor PT24 and the n MIS transistor NT23 and having a gate for receiving the control signal RAS. The delay activating signal Sdelay is a signal obtained by delaying the activating signal SU (SL) by a predetermined time period. When the control signal RAS is at the "H" and the semiconductor memory device is in an operation state, the p MIS transistor PT24 is in an off state and the n MIS transistor NT24 is in an on state. Accordingly, the signal $\overline{SU}$ ($\overline{SL}$) which is an inversion of the delay activating signal Sdelay is generated from a node N35.

When the control signal RAS is at the "L" and the semiconductor memory device is in a standby state, the p MIS transistor PT24 is in the on state and the n MIS transistor NT24 is in the off state. Accordingly, the control signal $\overline{SU}$ ($\overline{SL}$) attains the "H" level irrespective of a signal potential of a node N34. Note that, since in FIG. 7 the signals $\overline{SU}$ and $\overline{SL}$ are generated from the activating signals SU and SL, respectively, in the same circuit arrangement, that for the sense amplifier activating signal SL is shown in parenthesis.

While the arrangement of the first activating signal generating circuit 10 is not shown which generates the first activating signals SU and SL in response to the activating signal SFU (SFL) from the SF signal generating circuit 9, any circuit arrangement for simply buffering the control signal SFL and SFU may be employed.

FIG. 8 shows arrangements of two pairs of bit lines in each of the memory cell blocks 1a and 1b and the related sense amplifier band 2a in detail. The bit lines are of the folded bit line pair arrangement wherein the bit lines BL and $\overline{BL}$ are provided in pair. A memory cell MC is disposed at a crossing portion between one word line WL and a pair of bit lines. The memory cell MC comprises a memory capacitor C for storing information in the form of electric charges and a memory transistor MT responsive to a signal potential on the word line WL for connecting the memory capacitor to the bit line BL (or $\overline{BL}$).

In order to differentially sense and amplify a signal potential on a bit line pair, provided to each bit line pair are a p channel sense amplifier PSA comprising cross coupled p MIS transistors PT40 and PT41, a gate of the former coupled to a drain of the latter and a drain of the former to a gate of the latter, and an n channel sense amplifier NSA comprising cross coupled n MIS transistors NT40 and NT41, a gate of the former coupled to a drain of the latter and a drain of the former to a gate of the latter. In order to activate the p channel sense amplifier PSA, a p MIS transistor PT45 is provided which becomes conductive in response to the second sense amplifier activating signal $\overline{SU}$ and transmits the power supply potential Vcc to sources of the p MIS transistors PT40 and PT41. In order to activate the n channel sense amplifier NSA, provided are an n MIS transistor NT45 which becomes conductive in response to the control signal SFU and transmits a potential of the ground potential Vss level to sources of the n MIS transistors NT40 and NT41, and an n MIS transistor NT46 which becomes conductive in response to the sense amplifier activating signal SU and similarly transmits the potential of the ground potential Vss level to the sources of the n MIS transistors NT40 and NT41. The signal SFU activates the transistor NT45 of a relatively small size to cause initial precise, but slow, sensing operation. The signal SU activates the transistor NT46 of a relatively large size to cause main rapid sensing operation.

A precharging/equalizing circuit EQ is provided for precharging and equalizing each bit line pair to a predetermined potential $V_{BL}$ when the semiconductor memory device is in the stand by state (when the signal $\overline{RAS}$ is at the "H"). The precharging/equalizing circuit EQ comprises an n channel MIS transistor T20 being rendered conductive in response to an equalization instructing signal BLEQ to electrically short-circuit the bit lines BL and $\overline{BL}$ and n channel MIS transistors T21 and T22 being rendered conductive in response to the equalization instructing signal BLEQ to transmit the predetermined potential $V_{BL}$ to the bit lines BL and $\overline{BL}$.

Bit line selecting switches BSA and BSB are provided to each bit line pair in order to selectively connect the bit line pairs to the sense amplifiers. The selecting switch BSA selectively connects the bit line pair of BL and $\overline{BL}$ of the memory cell block 1a to the sense amplifier band 2a in response to a selection control signal SA.

The bit line selecting switch BSB selectively connects the bit line pair of BL and $\overline{BL}$ of the memory cell block 1b to the sense amplifier band 2a in response to a connection control signal SB. The selecting switch BSA comprises transfer gates T10 and T11 being turned on in response to the selection control signal SA. The selecting switch BSB includes transfer gates T15 and T16 being rendered conductive in response to the control signal SB.

Provided to each bit line pair is an IO switch IOSW for connecting a pair of bit lines to the I/O bus 40 in response to a column selecting signal CS from the column decoder 16. While four pairs of bit lines are connected to four pairs of buses of the I/O bus 40 in response to the column selecting signal CS, FIG. 8 shows only two pairs of bit lines selected simultaneously as a representative. The I/O switch IOSW includes transfer gates T30 and T31 being rendered conductive in response to the column selecting signal CS. The paired IO switches IOSWs connect four pairs of bit lines to the different I/O bus pairs. Ordinarily, the potential $V_{BL}$ for precharging and equalizing the bit line pair of BL and $\overline{BL}$ to a predetermined potential in a stand-by state is set to the power supply potential Vcc or to a potential level one half of the same. Now, an operation thereof will be described with reference to operation waveform diagram shown in FIG. 9, wherein FIG. 9 (f) shows levels of the connection control signals SA–SD of a conventional DRAM and FIG. 9 (g) shows signal levels of the connection control signals SA–SD of the modified conventional DRAM. An operation of the modified conventional DRAM shown in FIG. 9 (g) will be described in the following.

When the control signal $\overline{RAS}$ is at the "H", the semiconductor memory device is in the stand-by state wherein the bit line pair of BL and $\overline{BL}$ is maintained at the predetermined potential $V_{BL}$ by the precharging/equalizing circuit EQ. The connection control signals SA–SD are at a boosted potential level of Vcc+α higher than the power supply voltage Vcc. Thus, each of the bit line selecting switches BSA and BSB is in the on state, each bit line pair of the memory cell blocks 1a and 1b is connected to the sense amplifiers PSA and NSA and similarly the memory cell blocks 1c and 1b are connected to the sense amplifiers included in the sense amplifier band 2b.

When the control signal RAS falls to the "L", the semiconductor memory device is brought into the operation state. In response to falling of the control signal $\overline{RAS}$ to the "L", the row address buffer 5 is activated, thereby receiving 9-bit addresses A0–A8 applied to the address input terminals 52 to generate the internal row address signals RA0, $\overline{RA0}$–RA8 and $\overline{RA8}$. The row predecoder 13 predecodes the predetermined internal address signals RA2, $\overline{RA2}$–RA7 and $\overline{RA7}$ from the row address buffer 5 to generate the predecoded signals Xi, Xj and Xk. Now, consider a case wherein out of the predecoded signal Xi, the predecoded signal X1 is at the "H" and the other predecoded signals X2, X3 and X4 are at the "L" level and the memory cell block 1a is selected. The row decoder 3 decodes the predecoded signals Xi, Xj and Xk from the predecoder 13. A unit row decoder is selected wherein all of the 3-bit predecoded signals Xi, Xj and Xk are at the "H".

Meanwhile, in response to the control signal $\overline{RAS}$ changing toward the "L", the ϕx generating circuit 7 generates the word line driving master signal ϕx and applies the same to the sense amplifier control circuit 23 and the ϕx subdecoder 12. The ϕx subdecoder 12 subdecodes the word line driving master signal ϕx by the internal address signals $\overline{RA0}$, RA1 and from the row address buffer 5 and causes only one of the word line sub-decoded signal ϕx1–ϕx4 to rise to the "H" and transmits the same to the word driver 4. The word driver 4 selects one word line in response to the decoded signal from the row decoder 3 and the word line sub-decoded signal from the ϕx subdecoder 12 and causes a potential thereof to rise to the "H" level. In this example, the word line included in the memory cell block 1a is selected. When the word line WL is selected and a potential thereof is raised, the memory transistor MT in the memory cell MC is rendered conductive, so that a signal potential stored in the related memory capacitor C is transmitted to the related bit line in each bit line pair, thereby producing a potential difference between bit lines in each bit line pair.

Meanwhile, the shared sense amplifier control signal generating circuit 8 causes the connection control signal SB to the "L" level in response to the predecoded signal Xi from the row predecoder 13 and the signal $\overline{RAS}$ of the low level (the signal RAS of the high level) is generated from the RAS buffer 6, and is applied to the shared sense amplifier control signal generating circuit 8 to separate the sense amplifier band 2a from the memory cell block 1b. On this occasion, the connection control signals SA, SC and SD still remain at the boosted potential level of Vcc+α.

Consequently, the SF signal generating circuit 9 included in the sense amplifier control circuit 23 generates a signal for activating either the sense amplifier band 2a or the sense amplifier band 2b in response to the word line driving master signal ϕx from the ϕx generating circuit 7 and the predecoded signal Xi from the predecoder 13. In the operation waveform diagram shown in FIG. 9, the control signal SFU attains the "H" level and the control signal SFL remains at the "L". In response thereto, the n channel sense amplifiers NSA of the sense amplifier band 2a are activated, whereby the bit line at the lower potential starts being discharged. Subsequently, the first sense amplifier activating signal SU is generated in response to the control signal SFU, and then the second sense amplifier activating signal $\overline{SU}$ is generated after the lapse of a predetermined delay time period. As a result, both of the n channel sense amplifiers NSA and the p channel sense amplifiers PSA in the sense amplifier band 2a are activated, whereby the bit line at the lower potential is discharged to the ground potential Vss level and the bit line at the higher potential is charged to the power- supply potential Vcc level.

On this occasion, the shared sense amplifier control signal generating circuit 8 lowers the connection control signal SA down to the power supply potential Vcc level in response to the generation of the control signal SFU and after establishing the potential on the bit line pair at the power supply potential Vcc level and the ground potential Vss level, the circuit 8 boosts the connected control signal SA to the voltage level of Vcc+α higher than the power supply voltage.

While the non-selected cell blocks 1c and 1d are connected to the sense amplifier band 2b, the sense amplifier activating signals SFL, SL and $\overline{SL}$ remain in the same state as the stand-by state and the sense amplifiers included in the sense amplifier band 2b remain inactive.

As the sensing operation proceeds, the control signal $\overline{CAS}$ falls to the "L" and the CAS buffer 19 generates internal control signals for activating the operation of the column selecting circuitry. In response thereto, the column address buffer 14 generates the internal column address signals CA0, $\overline{CA0}$-CA8, and $\overline{CA8}$. The column predecoder 15 predecodes the internal column address signals from the column address buffer 14 to generate the column predecoded signals Yi, Yj, Yk and Yl and applies the same to the column decoder 16. The column decoder 16 selects a unit column decoder in which all the predecoded signals Yi, Yj, Yk and Yl are at the "H" to generate the column selecting signals CS of the "H". In response thereto, 4-bit, that is, four pairs of bit lines are selected and the IO switches IOSW become conductive, whereby the selected 4-bit bit line pairs are connected to the I/O bus 40. One pair among the four pairs of buses in the I/O bus 40 is selected by the I/O decoder 17, which is connected to the read/write control circuit 18. When the control signal from the read/write buffer 20 indicates the reading mode, the data on the I/O bus selected by the I/O decoder 17 is transferred to the output buffer 22 and then it is applied as the output data DOUT to the output terminal 56.

In the writing operation mode of the semiconductor memory device, the writing data is transferred onto the selected I/O bus through the input buffer 21 and then written in the selected memory cells through the same operation as described above.

The above described operation waveform diagram shown in FIG. 9 are disclosed in, for example, Japanese Patent Laying Open No. 60-694. According to the prior art, the selecting switch BS (generically represents the switches BSA, BSB, ...) is turned on when the semiconductor memory device is in a stand by state for the purpose of equalizing a precharge potential of each bit line pair and maintaining input nodes of a sense amplifier at the precharge potential.

With the above described arrangement, by rendering a sense amplifier non-operated in response to an address signal (block selection designating signal), charging and discharging currents can be reduced during the sensing operation, thereby reducing power consumption.

In addition, in the prior art, the reasons are as follows why the blocks connected to non-operated sense amplifiers (the sense amplifier band 2b according to the operation waveform diagram shown in FIG. 9) are connected to these sense amplifiers. Namely, interconnection capacitances exist on the signal lines transmitting the shared sense amplifier control signals SA-SD and gate capacitances of the MIS transistors constituting the switch BS also exist. Accordingly, setting the signals SA-SD to the "L" level results in wasteful discharge of the electric charges charging the parasitic capacitance on the signal interconnection line and the gate capacitance of the switch BS, which causes the power consumption of the memory device to increase. In addition, setting the control signals SC and SD to the "L" in order to separate the memory blocks similarly connected to the non-operated sense amplifiers (blocks 1c and 1d in the above described example) from the sense amplifiers results in the increase in the number of signal lines of the ground potential Vss level, which increases the noise due the coupling capacitance and might cause the semiconductor memory device to malfunction.

In addition, the reason why the control signals SA-SD are boosted up to the boosted level Vcc+α is that when the semiconductor memory device is operated during the fluctuations of the power supply voltage Vcc under a certain condition, a case may occur in which a bit line potential becomes higher than potentials of the control signals SA-SD, so that the switch BS which has to remain conductive becomes non-conductive, whereby no information of the memory cells might be transmitted to the input nodes of the sense amplifiers. In the prior art, the precharge potential of the bit line is set to the power supply potential Vcc level (to be exact, Vcc-Vth level). Here, Vth is a threshold voltage of the transfer gate included in the precharging/equalizing circuit. In such a case of power supply voltage fluctuations, the memory device may malfunction. The control signals SA-SD are set to the boosted level Vcc+α higher than the power supply voltage Vcc in order to avoid the malfunction thereof.

When Vcc=5V, and Vth=1.0V, the value of α may sufficiently be 1.5 through 2.5V.

Furthermore, the control signal SA of the bit line connecting switch BSA for connecting the operating sense amplifier band (the sense amplifier band 2a in the case of the example shown in FIGS. 1 and 9) with the memory cell block (1a) is once lowered to the power supply voltage level during the operation of the sense amplifiers as shown in FIG. 9(g), to make the sense amplifiers more sensitive by temporarily increasing the on-resistance of the switch BSA and connection resistance between a bit line and a sense amplifier. In other words, a bit line is weakly connected to an associated sense amplifier to enhance the sensing speed.

However, in the above-described arrangement of the control signals, the following problems arise. Namely, when the control signal is set to the power supply voltage Vcc as shown in FIG. 9 (f), while a read voltage from a memory cell is boosted to the power supply voltage Vcc level by a sense amplifier, the power supply voltage Vcc level is transmitted to a bit line pair through an insulated gate type field effect transistor of the switch BS, so that a voltage on the bit line is reduced by a threshold voltage of the transistor included in the switch BS. Accordingly, in the rewriting of data to a selected memory cell, a voltage of Vcc-Vth level lower than the power supply voltage Vcc is written, so that the amount of electric signal charges of the of the "H" level is reduced, whereby a sufficient potential difference between the bit lines can not be produced in reading the signals of the "H" level.

As shown in FIG. 9 (g), when the control signals SA-SD are boosted to a level higher than the power supply voltage Vcc to set the transistors T10 and T11 or T15 and T16 of the switch BSA or BSB to a more highly conductive state wherein no signal loss therethrough occurs, while there occurs no such loss of a signal voltage, it is necessary to maintain the boosted level for a long time period (the time period varies depending on refreshing standard of the memory device. For example, in the case of 1 Mbit DRAM, 8 ms., while in the case of a 4 Mbit DRAM, 16 ms.) during a stand-by state or the like. In such a case, although a circuit for maintaining the control signals SA-SD at the boosted level is provided, leak currents in the signal lines transmitting the control signals SA-SD exceed holding capability of such level holding circuit, so that the potential levels of the control signals SA-SD fall, and therefore the performance which the boosted level should implement can not be obtained, resulting in deterioration in the characteristics of the semiconductor memory device or reduction in production yield.

SUMMARY OF THE INVENTION

An object of the present invention is to provide an improved shared sense amplifier control signal generating circuit in a dynamic type semiconductor memory device to solve such problems as described above.

Another object of the present invention is to provide a shared sense amplifier control signal generating circuit in a dynamic type semiconductor memory device in which malfunction and deterioration in the characteristics can be prevented.

A still further object of the present invention is to provide a shared sense amplifier control signal generating circuit in a dynamic type semiconductor memory device in which the amount of H level charges of stored signals in a memory cell can be increased.

Still another object of the present invention is to provide a shared sense amplifier control signal generating circuit in a dynamic type semiconductor memory device in which a shared sense amplifier control signal needs not to be maintained at a voltage different from a power supply voltage for a long time period.

A still further object of the present invention is to provide a shared sense amplifier control signal generating circuit in a dynamic type semiconductor memory device enabling production yield to be improved.

A still further object of the present invention is to provide a method of generating a shared sense amplifier control signal in a dynamic type semiconductor memory device in which malfunction and deterioration in the characteristics can be prevented.

A still further object of the present invention is to provide a method of generating a shared sense amplifier control signal in a dynamic type semiconductor memory device in which the amount of stored signal charges of the "H" level in a memory cell can be increased.

A still further object of the present invention is to provide a method of generating a shared sense amplifier control signal in a dynamic type semiconductor memory device in which the shared sense amplifier control signal needs not to be maintained at a voltage higher than a power supply voltage for a long time period.

A still further object of the present invention is to provide a method of generating a shared sense amplifier control signal in a dynamic type semiconductor memory device by which production yield can be improved.

In a method of generating a shared sense amplifier control signal according to the present invention, a control signal level to be applied to a bit line/sense amplifier connection element for connecting a sense amplifier to be activated and a memory block to be connected to the sense amplifier is set at a first level different from a power supply voltage only in a sense amplifier activation period and it is set at the power supply voltage level in the other periods.

Namely, the shared sense amplifier control signal generating circuit according to the present invention comprises first circuit means which, when an externally applied operation cycle defining signal indicates a stand-by state of the semiconductor memory device, generates a reference voltage and connects sense amplifiers to the respective columns of memory blocks, thereby connecting the sense amplifiers with the corresponding columns of the related two blocks, and second circuit means which, when the operation cycle defining signal indicates an operation state of the semiconductor memory device, generates a control signal of a first voltage level different from the reference voltage in response to a memory block designating signal and a sense amplifier activating signal and applies the same to bit line connecting means, thereby connecting only the respective columns of a block designated by the block designating signal with the corresponding sense amplifiers to be activated. This first voltage level causes the bit line connecting switch to shift into a higher conductive state than at the reference voltage level. In that higher conductive state, a signal voltage can be transferred through an MIS transistor without a voltage loss of the threshold voltage of the MIS transistor.

The sense amplifier activating signal is generated in response to the operation cycle defining signal and the block designating signal to activate only the sense amplifiers related to a block including selected memory cells, while the sense amplifiers in the remaining blocks are rendered inactive.

Both of the two memory blocks related to the inactive sense amplifiers are connected to these inactive sense amplifiers by the shared sense amplifier control signal of the reference voltage level.

According to the above described arrangement, in order to connect the activated sense amplifiers to the bit lines through the connecting means in the deeper on state, the shared sense amplifier control signal is set at the first level only in the sense amplifier activating period. Accordingly, the signals of the reference voltage level sensed and amplified by the sense amplifiers are transmitted onto the bit lines without signal loss, so that it is possible to eliminate the loss of the written voltage of the "H" level of the memory cells, thereby increasing the amount of the stored signal charges of the "H" level.

Furthermore, since the first voltage level different from the reference voltage is set only in the sense amplifier activation period, it is possible to set the time period to be very short wherein the first level different from the reference voltage is maintained, it is not necessary to maintain the shared sense amplifier control signal at the first level for a long time period, so that fluctuations in a potential level of the control signal caused by leak currents and the like can be prevented, ensuring a stable operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a signal waveform diagram showing operations of the shared sense amplifier control signal generating circuit shown in FIGS. 11A through 11D.

DESCRIPTION OF THE PREFERRED EMBODIMENTS

Figure 10:
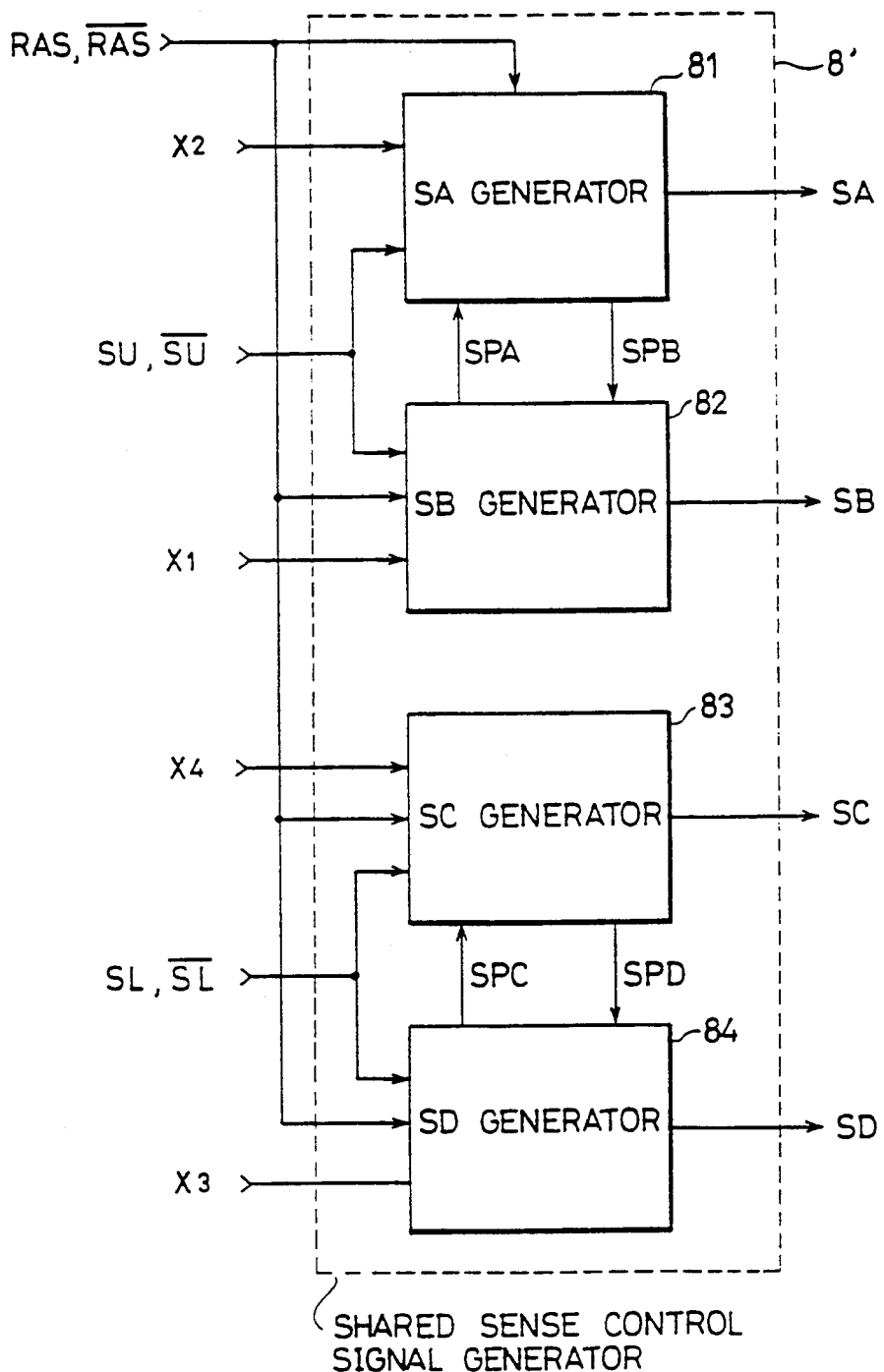
FIG. 10 is a block diagram showing an arrangement of a shared sense amplifier control signal generating circuit according to the present invention.

FIG. 10 is a block diagram schematically showing the arrangement of the shared sense amplifier control signal generating circuit according to one embodiment of the present invention. A shared sense amplifier control signal generating circuit 8' shown in FIG. 10 corresponds to the shared sense amplifier control signal generating circuit 8 shown in FIG. 1.

Referring to FIG. 10, the shared sense amplifier control signal generating circuit 8' comprises an SA generating circuit 81 for generating a shared sense amplifier control signal SA, an SB generating circuit 82 for generating a shared sense amplifier control signal SB, an SC generating circuit 83 for generating a shared sense amplifier control signal SC and an SD generating circuit 84 for generating a shared sense amplifier control signal SD.

The SA generating circuit 81 responsive to the row address strobe signals RAS and $\overline{RAS}$, the internal row address signal X2, the sense amplifier activating signals SU and $\overline{SU}$ and a boost instructing signal SPA, generates the shared sense amplifier control signal SA and applies the same to the sense amplifier band 2a (see FIG. 1) and also applies a boost instructing signal SPB to the SB generating circuit 82.

The SB generating circuit 82 responsive to the row address strobe signals RAS and $\overline{RAS}$, the sense amplifier activating signals SU and $\overline{SU}$ and the internal row address signal X1, generates the shared sense amplifier control signal SB and applies the same to the sense amplifier band 2a (see FIG. 1) and also generates the boost instructing signal SPA and applies the same to the SA generating circuit 81.

The SC generating circuit 83 responsive to the row address strobe signals RAS and $\overline{RAS}$, the internal row address signal X4, the sense amplifier activating signals SL and $\overline{SL}$ and a boost instructing signal SPC, generates the shared sense amplifier control signal SC and applies the same to the sense amplifier band 2b, and also generates a boost instructing signal SPD and applies the same to the SD generating circuit 84.

In response to the row address strobe signals RAS and $\overline{RAS}$, the internal row address signal X3 and the boost instructing signal SPD, the SD generating circuit 84 generates the shared sense amplifier control signal SD and applies the same to the sense amplifier band 2b (see FIG. 1), and also generates the boost instructing signal SPC and applies the same to the SC generating circuit 83.

Figures 1, 1A:
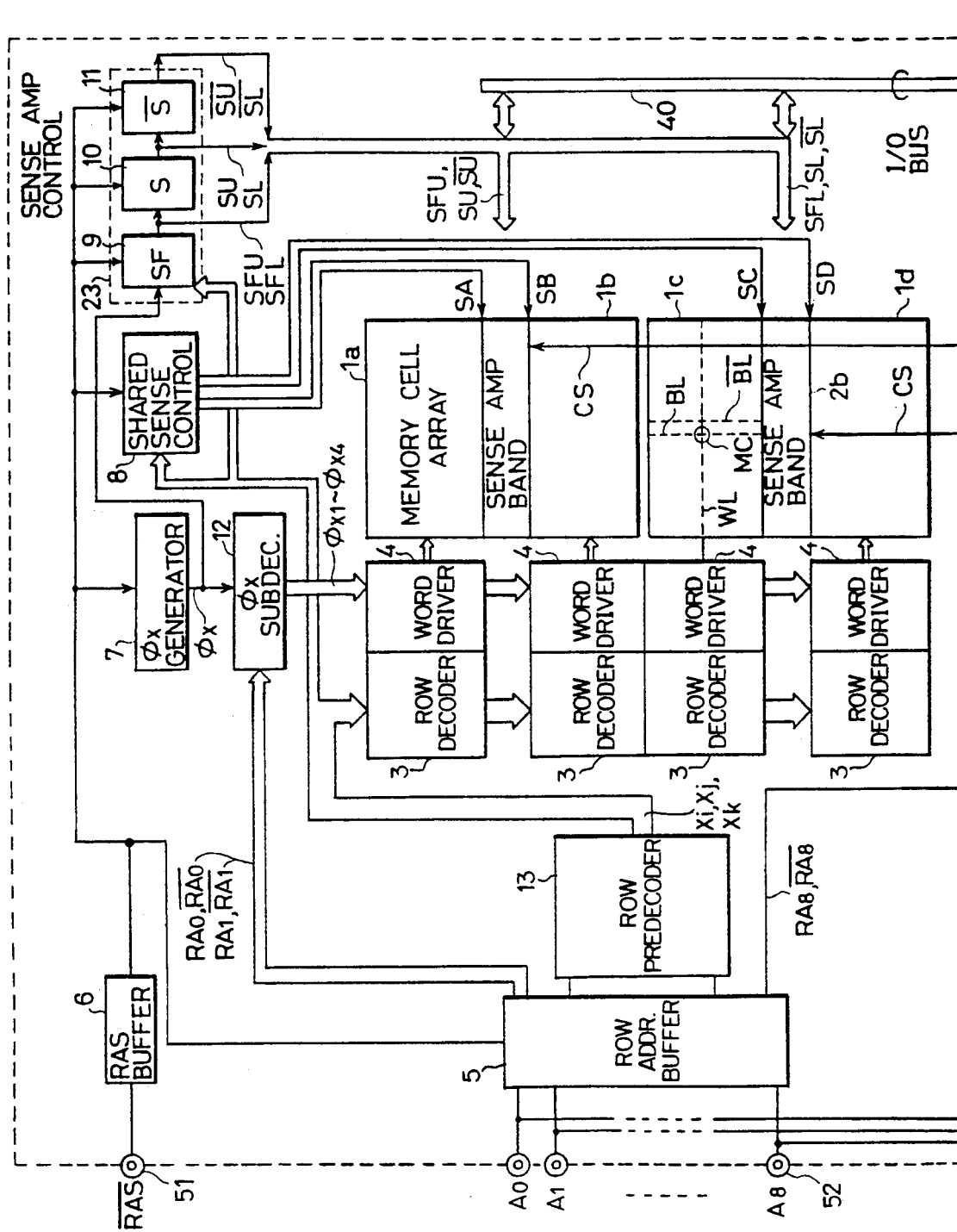
FIG. 1 is a block diagram showing an entire arrangement of a 256 KW×1 bit dynamic type semiconductor memory device of a multi-divisional bit line and shared sense amplifier arrangement.
Figure 1B:
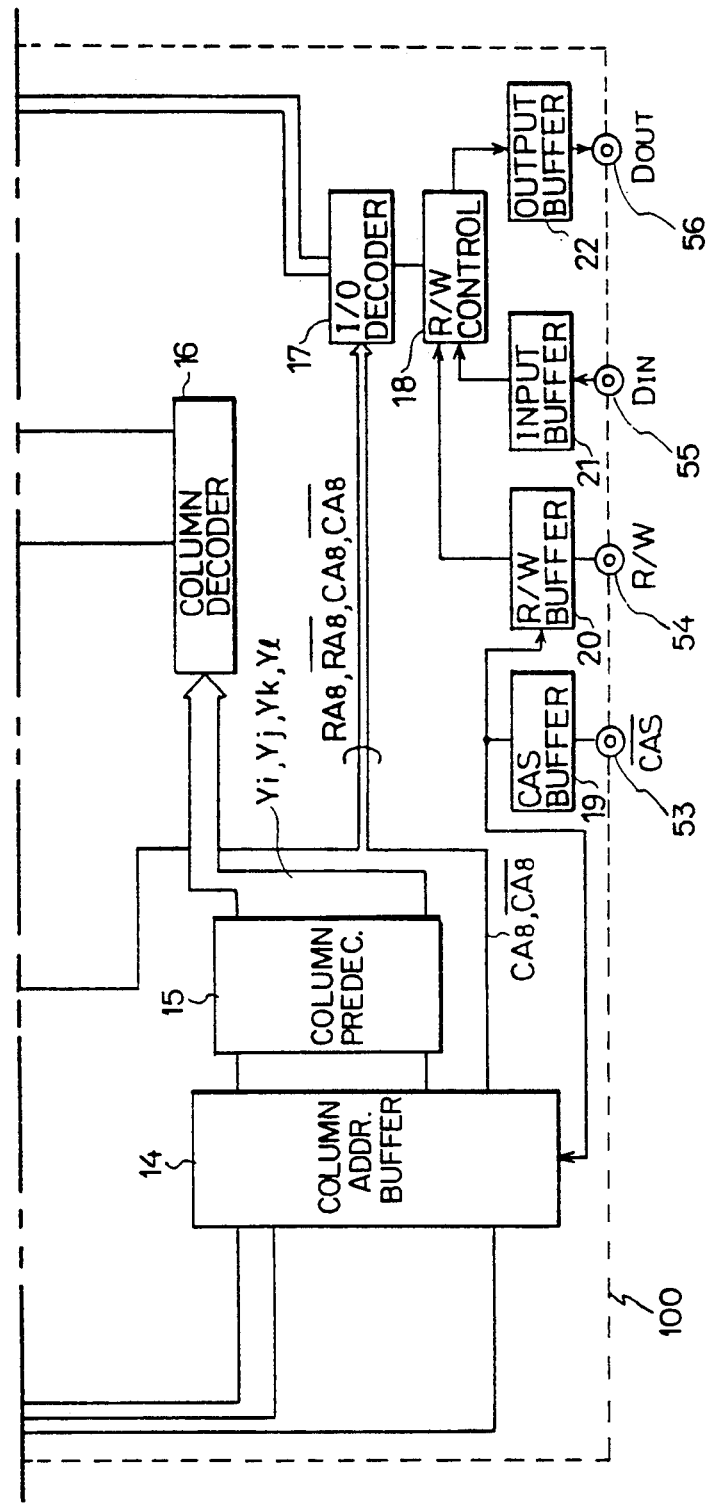
Figure 2:
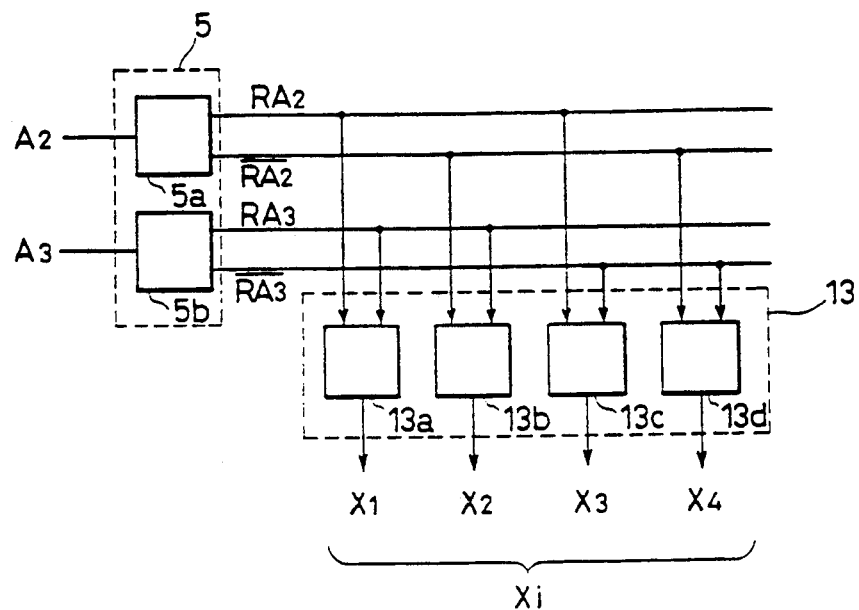
FIG. 2 is a diagram showing a schematic arrangement of conventional row address buffer and row predecoder.
Figure 3:
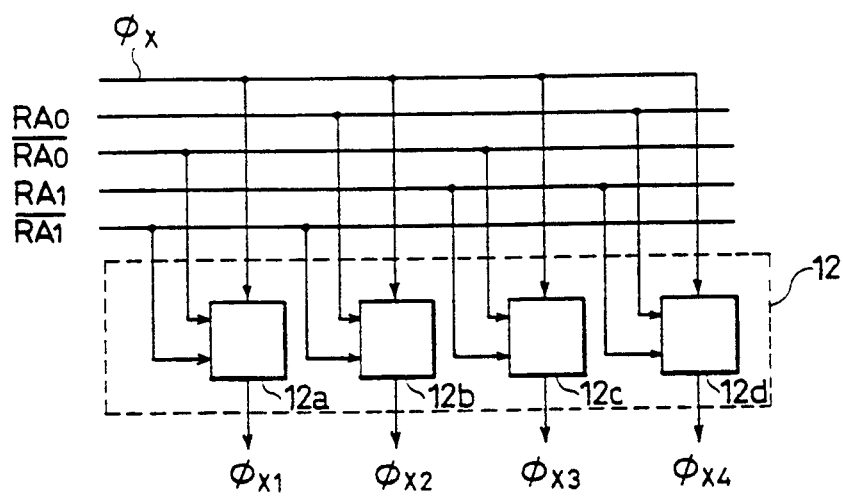
FIG. 3 is a diagram showing a schematic arrangement of a $\phi x$ subdecoder shown in FIG. 1.
Figure 4:
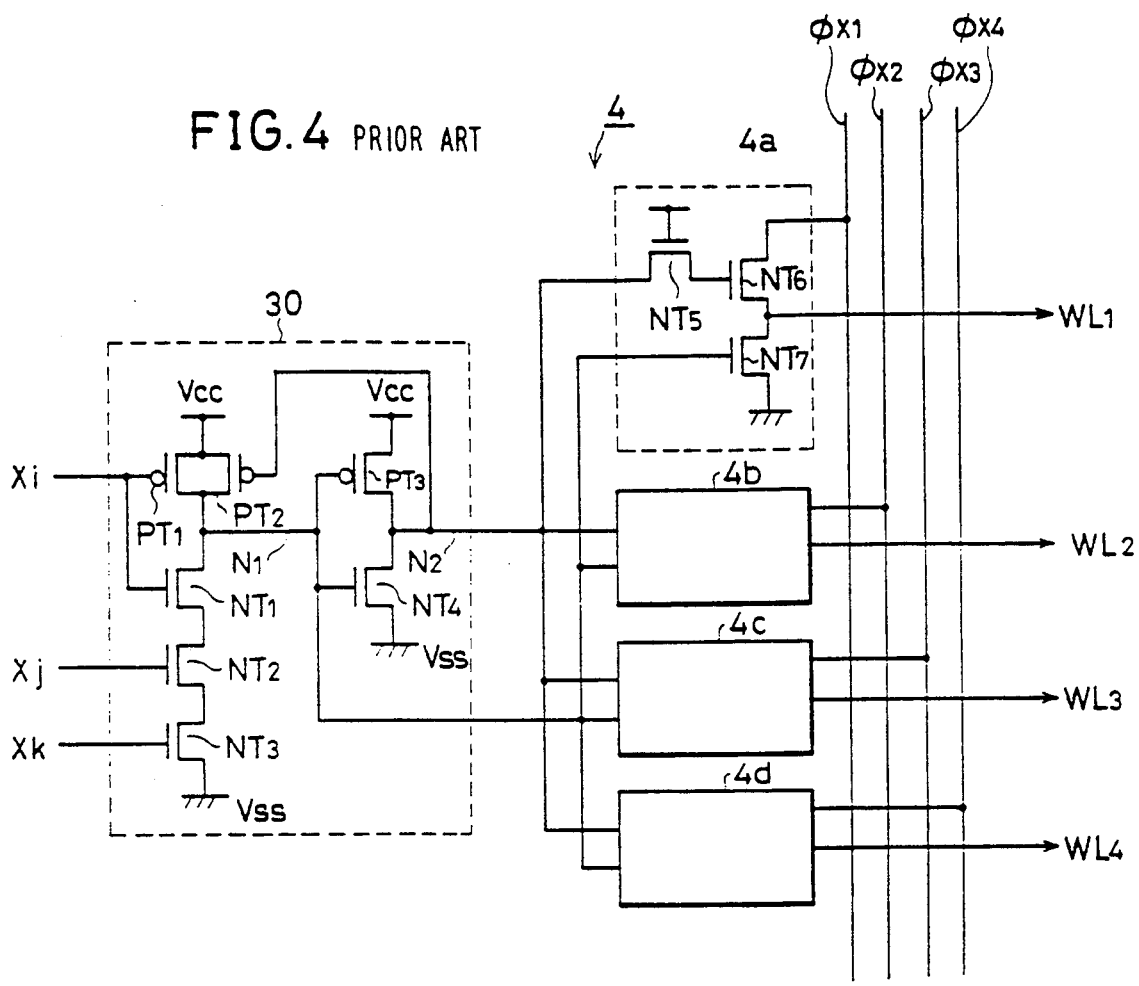
FIG. 4 is a diagram specifically showing an arrangement of row decoders and word drivers shown in FIG. 1.
Figure 5:
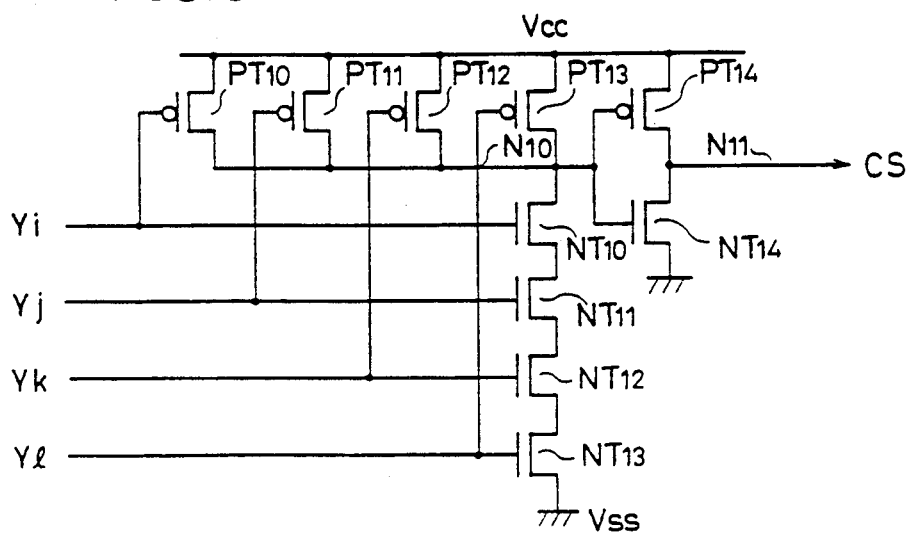
FIG. 5 is a diagram schematically showing an arrangement of a column decoder shown in FIG. 1.
Figure 6:
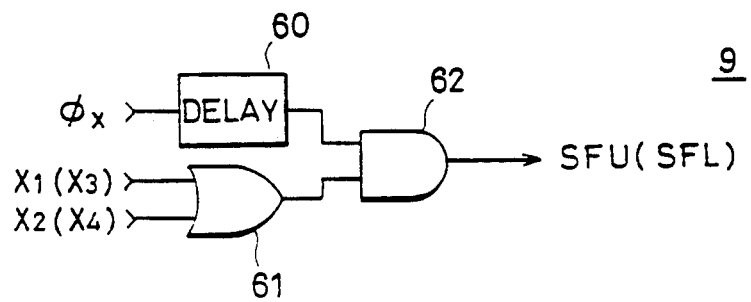
FIG. 6 is a diagram showing a specific arrangement of a SF signal generating circuit shown in FIG. 1.
Figure 7:
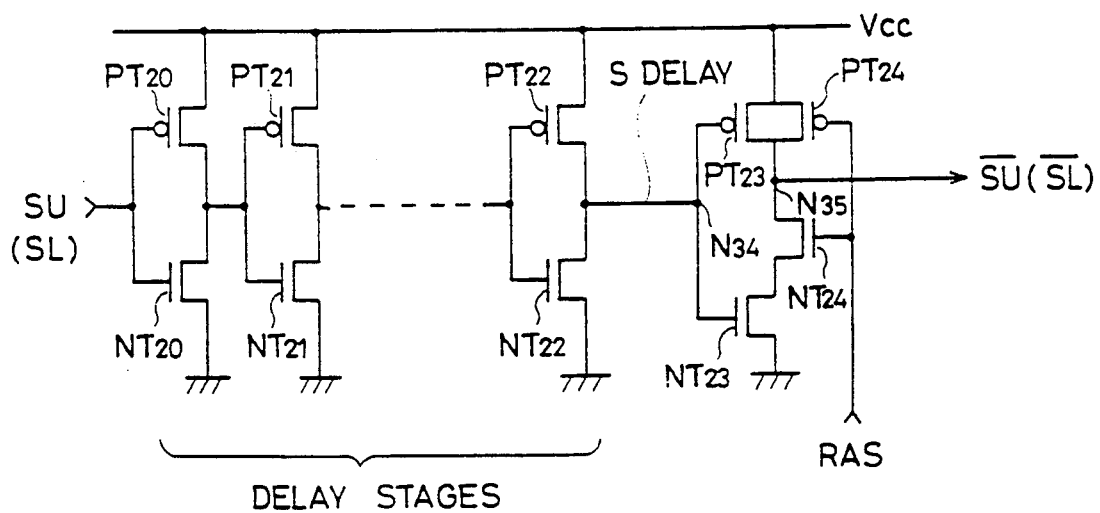
FIG. 7 is a diagram showing a specific arrangement of a sense amplifier activating signal generating circuit shown in FIG. 1.
Figure 8:
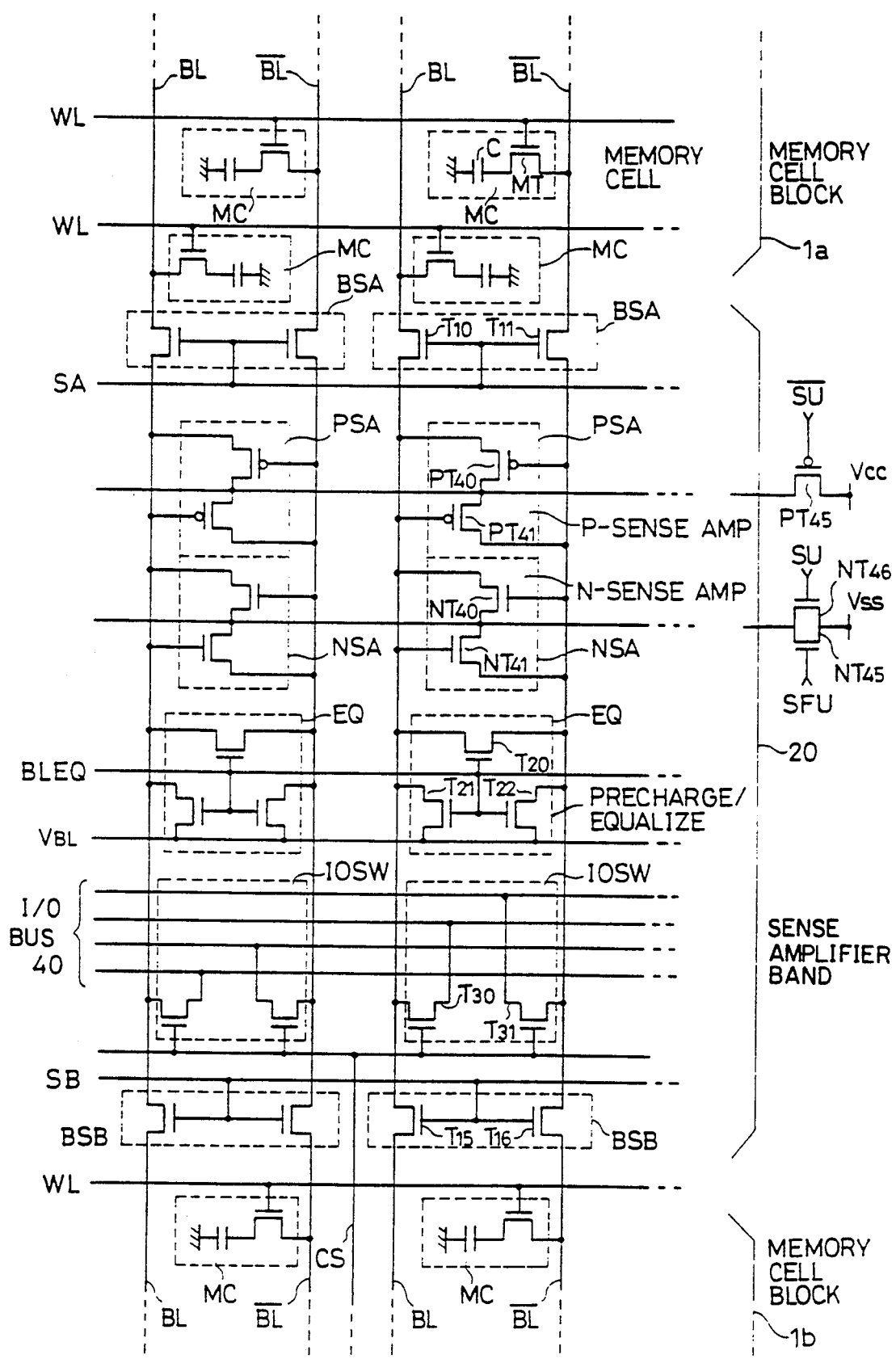
FIG. 8 is a diagram specifically showing an arrangement of a main part of the semiconductor memory device shown in FIG. 1.
Figure 9:
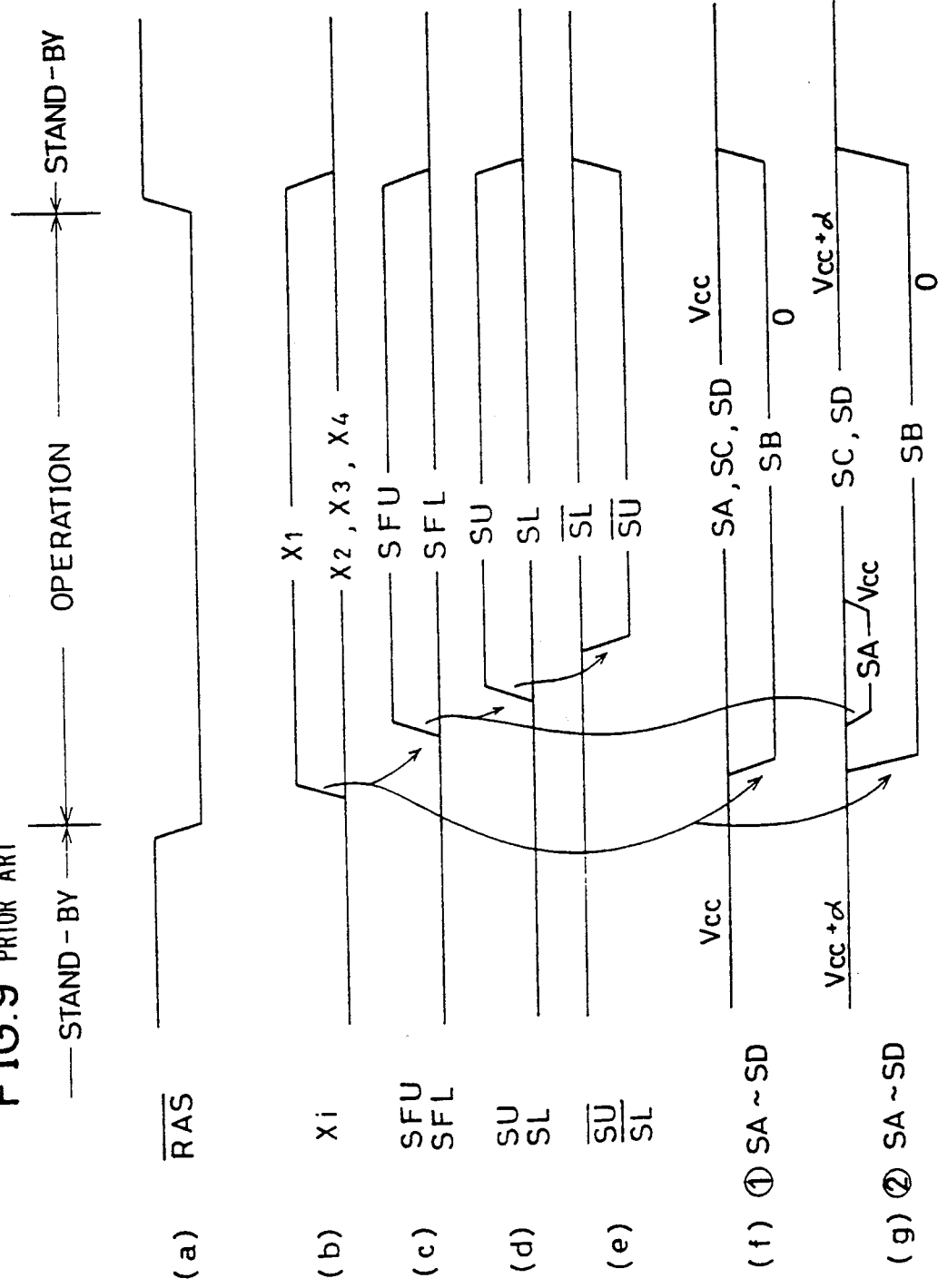
FIG. 9 is a signal waveform diagram showing a shared sense amplifier control signal of a conventional semiconductor memory device.

The row address strobe signals RAS and $\overline{RAS}$ are signals generated from the RAS buffer 6 shown in FIG. 1 and are signals for controlling operations of the row selecting circuitry which define a memory cycle of the semiconductor memory device. Namely, when the signal $\overline{RAS}$ is at the "L", the semiconductor memory device is in an operation state wherein memory operation (data writing/reading) is made, and when it is at the "H", the semiconductor memory device is in a stand-by state.

In addition, the internal row address signals X1–X4 designate the memory cell blocks 1a–1d shown in FIG. 1, respectively. Now, a brief description will be given to an operation thereof. When the signal $\overline{RAS}$ is at the "H", the semiconductor memory device is in the stand-by state. On this occasion, all of the shared sense amplifier control signals SA–SD are at the reference voltage (referred to as a power supply voltage Vcc level hereinafter) in the stand-by state. Accordingly, all the bit line connecting switches BS are in the on state, wherein the sense amplifier band 2a is connected to the memory blocks 1a and 1b and the sense amplifier band 2b is connected to the memory blocks 1c and 1d.

When the signal $\overline{RAS}$ falls to the "L", the memory device is brought into the operation stage. In response to the fall of the signal $\overline{RAS}$ to the "L", the external address signals A0–A8 are strobed as row address signals, so that the internal row address predecoded signals Xi, Xj and Xk are generated. The predecoded signal Xi among them is applied to the shared sense amplifier control signal generating circuit 8'. Now, it is assumed that the predecoded signal X1 is at the "H" level and the predecoded signals X2–X4 are at the "L" level. On this occasion, in response to the predecoded signal (block designating signal) X1 and the sense amplifier activating signals, the SB generating circuit 82 causes the boost instructing signal SPA to rise to the "H" level and applies the same to the SA generating circuit 81. Responsively, SA generating circuit 81 generates the boost control signal SA of the Vcc+α level further boosted to be higher than the power supply voltage Vcc. The SB generating circuit 82 generates the control signal SB of the "L" level. As a result, the sense amplifier band 2a is connected only to the designated memory cell block 1a and separated from the memory cell block 1b.

Meanwhile, since none of the sense amplifier control signals SL and $\overline{SL}$ is generated in the SC generating circuit 83 and the SD generating circuit 84, the control signals SC and SD of the power supply voltage Vcc level, similarly in the stand-by state, are generated.

With the above-described arrangement, only the shared sense amplifier control signal for connecting a memory block including selected memory cells with sense amplifiers is boosted to the Vcc+α level higher than the power supply voltage Vcc during the sense amplifier driving period, while the other memory block paired with the memory block including the selected memory cells is separated from the sense amplifiers. In addition, the shared sense amplifier control signal related to the inactive sense amplifiers is maintained at the power supply voltage Vcc level in the stand-by state. Accordingly, it is possible to store signal charges of the power supply voltage level in a memory cell without signal loss during the data writing/reading while maintaining low power consumption, allowing a sufficient read voltage to be supplied onto a bit line by a sufficient amount of stored signal charges during the sensing operation on the bit line.

Furthermore, in the stand-by state, the shared sense amplifier control signals SA-SD are maintained at the power supply voltage Vcc level and boosted during a short time of the sense amplifier driving period, so that a potential drop thereon is very slight even though leak currents are generated in a control signal line and it is possible to maintain the control signal lines at a level sufficient for use, whereby a sufficient margin for the leak currents in the control signal line can be obtained and a highly reliable semiconductor memory device can be achieved.

Figure 11A:
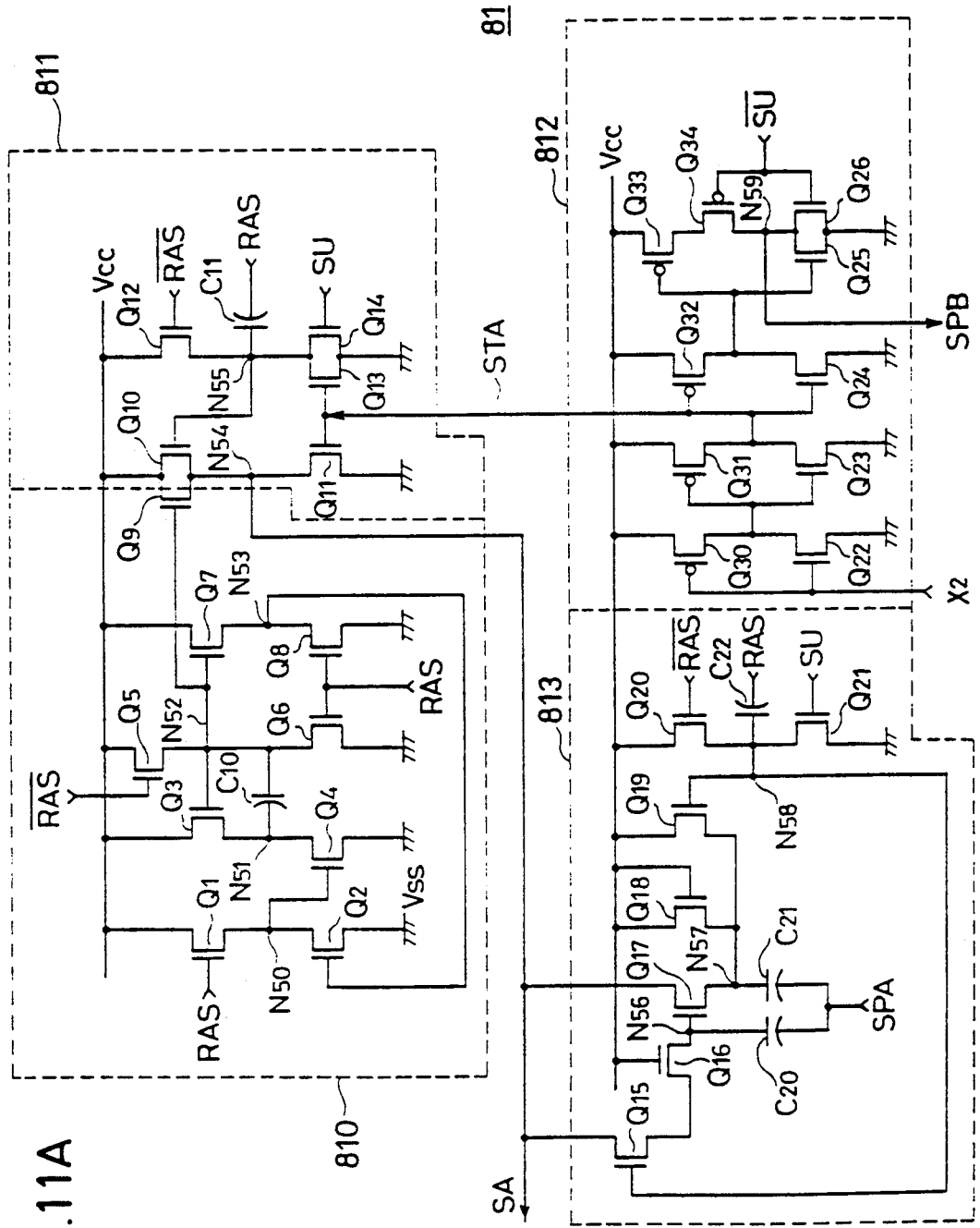
FIGS. 11A through 11D are diagrams showing examples of specific arrangements of the shared sense amplifier control signal generating circuit shown in FIG. 10.
Figure 11B:
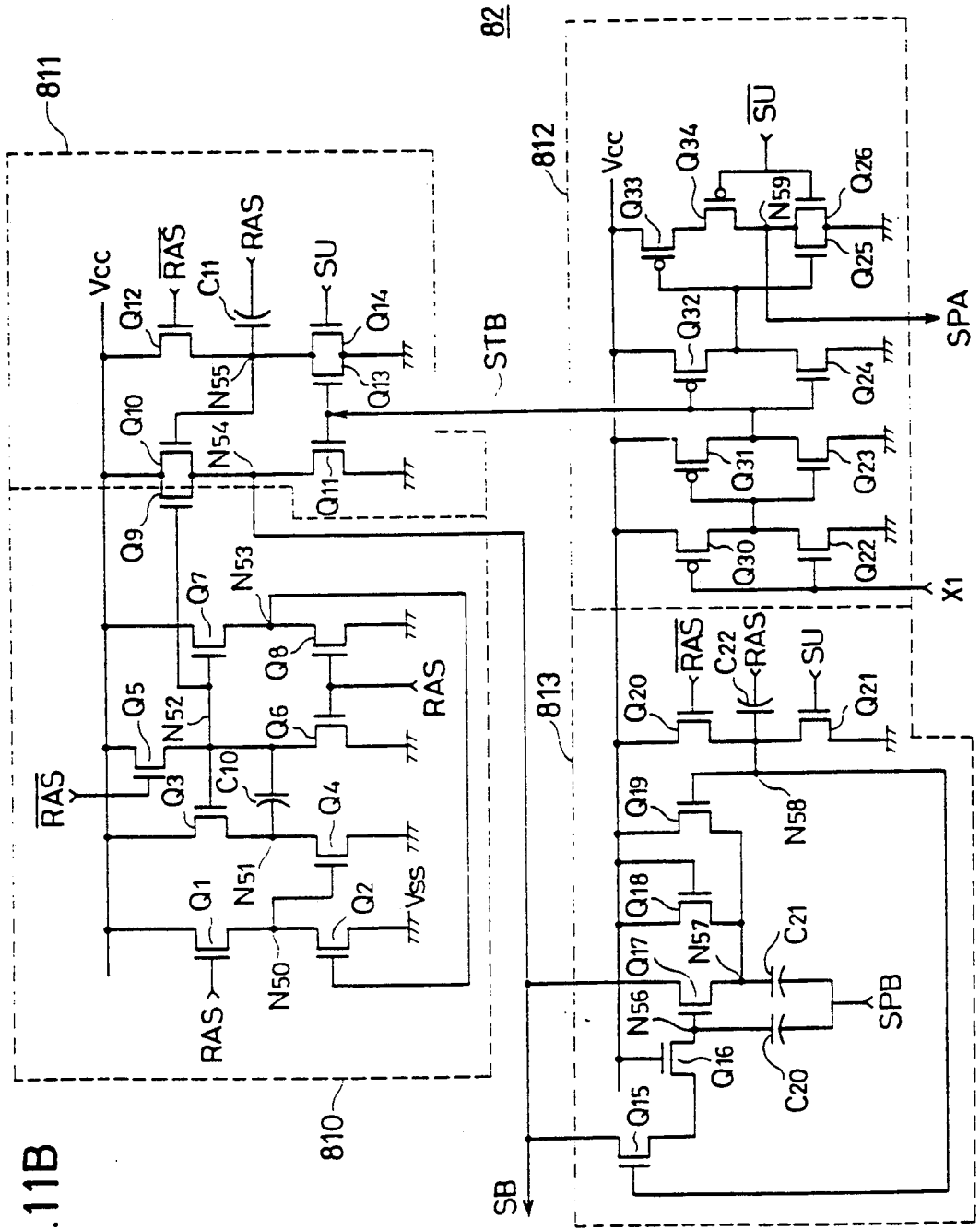
Figure 11C:
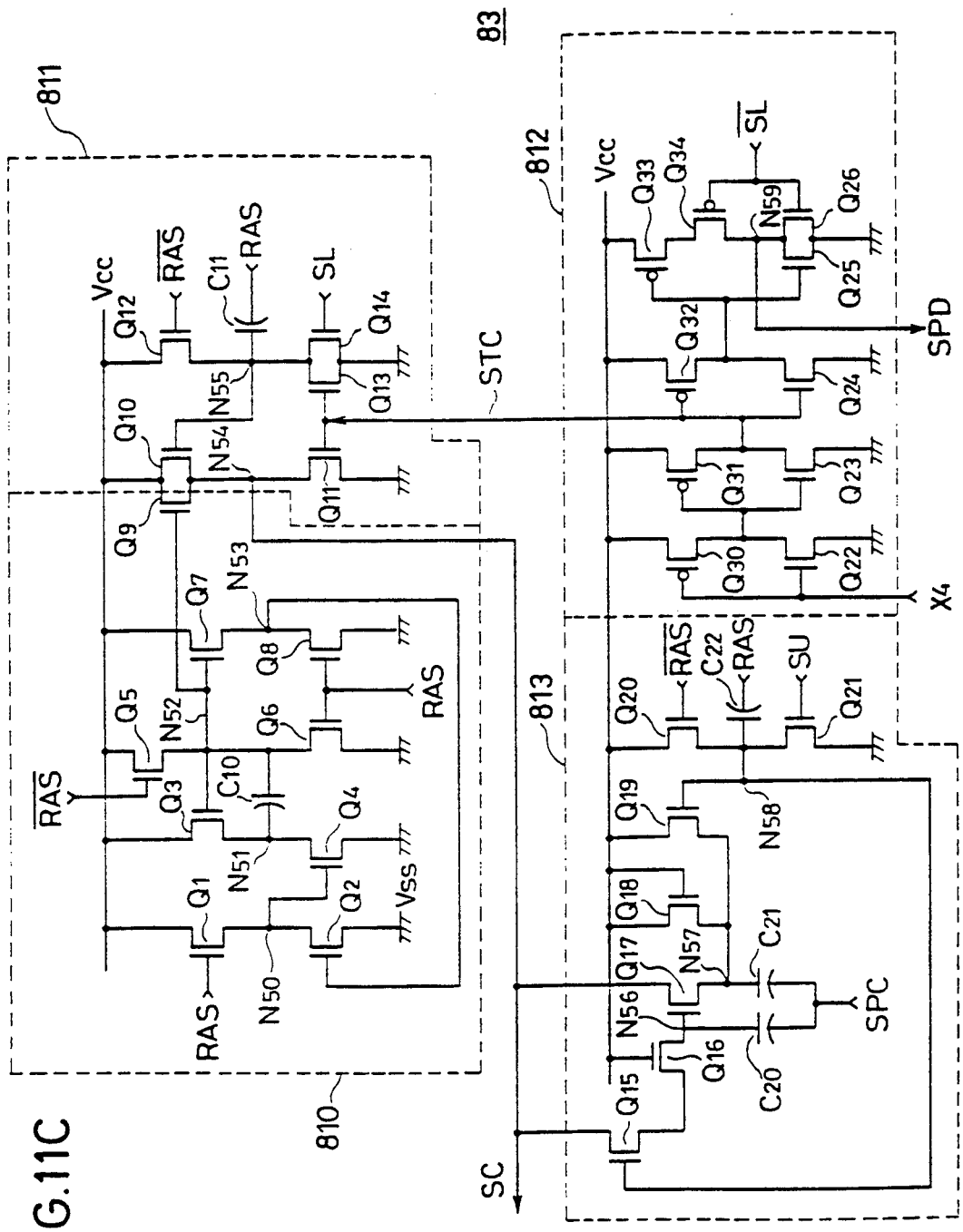
Figure 11D:
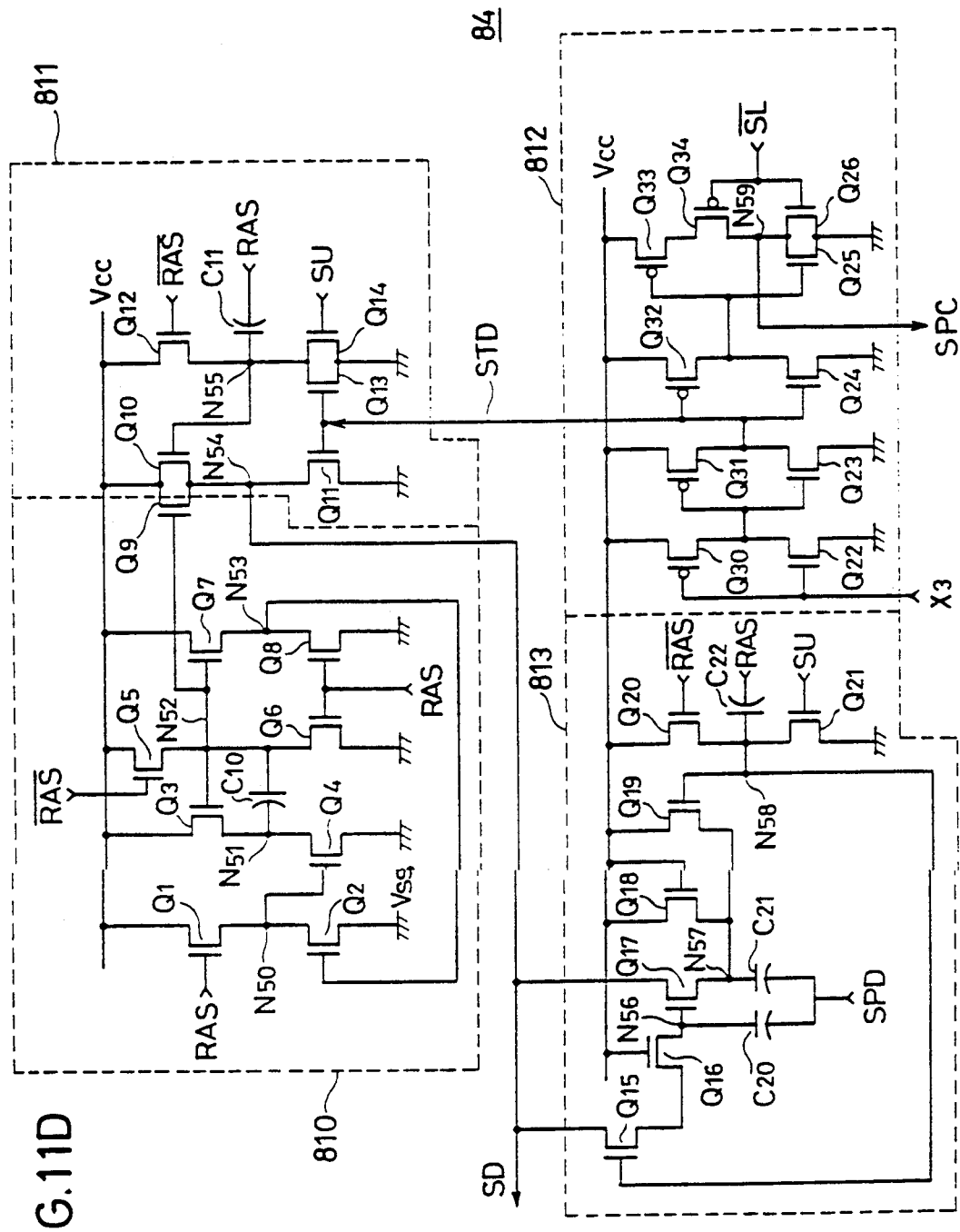

Now, referring to FIGS. 11A through 11D, a specific arrangement of the shared sense amplifier control signal generating circuit 8' will be described. FIG. 11A is a diagram showing an arrangement of the SA generating circuit 81, FIG. 11B is a diagram showing a specific arrangement of the SB generating circuit, FIG. 11C is a diagram showing a specific arrangement of the SC generating circuit and FIG. 11D is a diagram showing a specific arrangement of the SD generating circuit.

All the SA generating circuit 81, the SB generating circuit 82, the SC generating circuit 83 and the SD generating circuit 84 have the same circuit arrangement excluding the boost instructing signals and the predecoded signals applied thereto, and therefore, a specific description will be made only of the SA generating circuit 81 hereinafter.

Referring to FIG. 11A, the SA generating circuit 81 includes a circuit block 810 for maintaining the shared sense amplifier control signal SA at the power supply voltage Vcc level when the memory device is in the stand-by state (the signal $\overline{RAS}$ is at the "H" level), a circuit block 811 for setting the level of the control signal SA either to the ground voltage Vss level or to the power supply voltage Vcc level when the memory device is in the operation state (the signal $\overline{RAS}$ is at the "L" level), a circuit block 812 for generating the boost instructing signal SPB and the separation instructing signal STA, and a circuit block 813 for boosting the control signal SA.

The circuit block 810 includes n MIS transistors Q1-Q9 and a bootstrap capacitance C10. The n MIS transistor Q1 has one conduction terminal connected to the power supply voltage Vcc, the other conduction terminal connected to a node N50 and a gate receiving the signal RAS. The transistor Q2 has one conduction terminal connected to the node N50, the other conduction terminal connected to the ground potential Vss and a gate connected to a node N53. The transistor Q3 has one conduction terminal connected to the power supply voltage Vcc, a gate connected to a node N52, and the other conduction terminal connected to a node N51. The transistor Q4 has one conduction terminal connected to the node N51, the other conduction terminal connected to the ground potential Vss and a gate connected to the node N50. The transistor Q5 has one conduction terminal connected to the power supply voltage Vcc, the other conduction terminal connected to the node N52 and a gate receiving the control signal $\overline{RAS}$. The transistor Q6 has one conduction terminal connected to the node N52, the other conduction terminal connected to the ground potential Vss and a gate receiving the control signal RAS. The transistor Q7 has one conduction terminal connected to the power supply voltage Vcc, a gate connected to the node N52 and the other conduction terminal connected to the node N53. The transistor Q8 has one conduction terminal connected to the node N53, the other conduction terminal connected to the ground potential Vss and a gate receiving the control signal RAS. The transistor Q9 has one conduction terminal connected to the power supply voltage Vcc, the other conduction terminal connected to a node N54 and a gate connected to the node N52. The bootstrap capacitance C10 has one electrode connected to the node N52 and the other electrode connected to the node N51.

The circuit block 811 includes n MIS transistors Q10-Q14 and a bootstrap capacitance C11. The transistor Q10 has one conduction terminal connected to the power supply voltage Vcc, the other conduction terminal connected to the node N54 and a gate connected to a node N55. The transistor Q11 has one conduction terminal connected to the node N54, the other conduction terminal connected to the ground potential Vss and a gate receiving the separation instructing signal STA. The transistor Q12 has one conduction terminal connected to the power supply voltage Vcc, the other conduction terminal connected to the node N55 and a gate receiving the control signal $\overline{RAS}$. The transistor Q13 has one conduction terminal connected to the node N55, the other conduction terminal connected to the ground potential Vss and a gate receiving the separation instructing signal STA. The transistor Q14 has one conduction terminal connected to the node N55, the other conduction terminal connected to the ground potential Vss and a gate receiving the sense amplifier activating signal SU. The bootstrap capacitance C11 has one electrode connected to the node N55 and the other electrode receiving the control signal RAS.

The circuit block 813 includes n MIS transistors Q15-Q21 and bootstrap capacitances C20-C22. The transistor Q15 has one conduction terminal connected to the signal line SA (the same reference characters are allotted to the signal line and a signal transmitted thereon hereinafter), the other conduction terminal connected to one conduction terminal of the transistor Q16 and a gate connected to a node N58. The transistor Q16 has a gate coupled to the power supply voltage Vcc and the other conduction terminal connected to a node N56. The transistor Q17 has one conduction terminal connected to the signal line SA, a gate connected to the node N56 and the other conduction terminal connected to a node N57. The transistor Q18 has one conduction terminal and a gate connected to the power supply voltage Vcc and the other conduction terminal connected to the node N57.

The transistor Q19 has one conduction terminal connected to the power supply voltage Vcc, the other conduction terminal connected to the node N57 and a gate connected to the node N58. The transistor Q20 has one conduction terminal connected to the power supply voltage Vcc, the other conduction terminal connected to the node N58, and a gate receiving the control signal $\overline{RAS}$. The transistor Q21 has one conduction terminal connected to the node N58, the other conduction terminal connected to the ground potential Vss and a gate receiving the sense amplifier activating signal SU.

The bootstrap capacitance C20 has one electrode connected to the node N56 and the other electrode receiving the boost instructing signal SPA. The bootstrap capacitance C21 has one electrode connected to the node N57 and the other electrode receiving the boost instructing signal SPA. The bootstrap capacitance C22 has one electrode connected to the node N58 and the other electrode receiving the control signal RAS.

The circuit block 812 includes n MIS transistors Q22–Q26 and p MIS transistors Q30–Q34. The p MIS transistor Q30 and the n MIS transistor Q22 are complementarily connected between the power supply voltage Vcc and the ground potential Vss to constitute an inverter. Gates of the transistors Q22 and Q30 receive the predecoded signal X2. The transistors Q23 and Q31 are complementarily connected between the power supply voltage Vcc and the ground potential Vss to constitute an inverter. Gates of the transistors Q23 and Q31 receives an output signal from the inverter of the first stage (transistors Q22 and Q30).

The transistors Q24 and Q32 are complementarily connected between the power supply voltage Vcc and the ground potential Vss to constitute an inverter. The inverter comprising the transistors Q23 and Q31 of the second stage generates the separation instructing signal STA, which signal is applied to an input portion of the inverter (comprising the transistors Q24 and Q34) of the third stage.

The transistor Q33 has one conduction terminal connected to the power supply voltage Vcc, the other conduction terminal connected to one conduction terminal of the transistor Q34 and a gate receiving an output of the inverter of the third stage The transistor Q34 has a gate receiving the sense amplifier activating signal $\overline{SU}$ and the other conduction terminal connected to a node N59. The transistor Q25 has one conduction terminal connected to the node N59, the other conduction terminal connected to the ground potential Vss and a gate receiving the output signal of the inverter (comprising the transistors Q24 and Q32) of the third stage. The transistor Q26 has one conduction terminal connected to the node N59, the other conduction terminal connected to the ground potential Vss and a gate receiving the sense amplifier activating signal $\overline{SU}$. The boost instructing signal SPB for the SB generating circuit 82 is generated from the node N59. Now, operations thereof will be described with reference to the operation waveform diagrams in FIG. 12.

Now, consider a case wherein the control signal $\overline{RAS}$ is at the "H" level and the semiconductor memory device is in the stand-by state. On this occasion, the control signal RAS is at the "L" level, the n channel sense amplifier activating signal SU is at the "L" level and the p channel sense amplifier activating signal $\overline{SU}$ is at the "H" level. The predecoded signal X2 is also at the "L" level. The separation instructing signal STA is at the "L" level. In addition, the transistors Q25 and Q26 are in the on state and the transistors Q33 and Q34 are in the off state, so that the boost instructing signal SPB generated from the node N59 is also at the "L" level. This is also the case with the SB generating circuit, and therefore, the boost instructing signal SPA is at the "L" level.

In the circuit block 810, when the control signal $\overline{RAS}$ rises to the "H" level, the transistor Q5 is turned on and the transistors Q1, Q6 and Q8 are turned off. As a result, one electrode of the capacitance C10 which has been discharged to the "L" level until then, starts being charged to the power supply voltage Vcc level through the transistor Q5. As the capacitance C10 is charged, a potential of the node N52 rises. When it exceeds a threshold voltage of the transistor Q7, the node N53 starts being charged through the transistor Q7. A potential of the node N53 is being applied to the gate of the transistor Q2.

A potential of the node N50 remains at the "H" level because it has been charged through the transistor Q1 until the transistor Q2 is turned off. While the potential of the node N50 is at the "H" level, the transistor Q4 is in the on state to maintain a potential of the node 51 at the "L" level. The capacitance C10 continues to be charged through the transistor Q5 all the while until it is finally charged to a level of (Vcc-Vth), which value is obtained by subtracting a threshold voltage Vth of a transistor from the power supply voltage Vcc level. When charging the capacitance C10 (node N52) to a level of Vcc-Vth is completed, the potential of the node N53 similarly rises to the "H" level and the transistor Q2 is completely turned on, so that the potential of the node N50 falls to the "L" level of the ground potential Vss level. As a result, the transistor Q4 is brought into the off state, so that the node N51 is charged through the transistor Q3, The charge potential of the node N51 is transmitted to the node N52 through the capacitance C10. As a result, the potential of the node N52 rises up to the boosted level of Vcc+α higher than the power supply voltage Vcc.

A conductance ratio of the transistor Q3 to the transistor Q4 is set to be about 1:3 and therefore even if both of the transistors Q3 and Q4 are in the on state, discharging capability of the transistor Q4 is larger, so that the node N51 is maintained at the "L" level. Timing at which the transistor Q4 completely enters into the off state after the completion of charging the capacitance C10 to the (Vcc-Vth) level, can be regulated by adjusting sizes of the transistors Q2, Q8 and the like to appropriate values. The boosted voltage level Vcc+α of the node N52 is applied to the gate of the transistor Q9, thereby enabling the transistor Q9 to transmit the voltage of the power supply voltage Vcc level to the node N54, so that the signal line SA is set to the power supply voltage Vcc level.

Now, a description will be made of an operation when the control signal $\overline{RAS}$ falls to the "L" level to bring the semiconductor memory device into the operation state. In response to the falling of the control signal $\overline{RAS}$ to the "L" level, the address signals are strobed into the device to be predecoded for generating the predecoded signal Xi. Now, consider a case wherein the predecoded signal X1 is at the "H" level and the other predecoded signals X2, X3 and X4 are at the "L" level.

In the circuit 810, the transistors Q1, Q6 and Q8 are turned on in response to the control signal RAS of the "H" level. As a result, the node N50 attains the "H" level and the nodes N52 and N53 attain the "L" level. The transistor Q9 is turned off and all the stored charges in the capacitance C10 are discharged.

In the circuit block 811, in response to the fall of the control signal $\overline{RAS}$ to the "L" level, the transistor Q12 is turned off. In response to the rise of the control signal RAS to the "H" level, the node N55 is boosted to the Vcc+α level higher than the power supply voltage Vcc by the bootstrap function of the capacitance C11. As a result, the power supply voltage Vcc still keeps being transmitted to the node N54, so that the control signal SA remains at the power supply voltage Vcc level. The transistor Q7 does not enter into the off state immediately in response to the rise of the control signal RAS to the "H" level, but it gradually enters into the off state depending on the discharging function of the capacitance C10.

When the predecoded signal is generated from the row predecoder, in the circuit block 812 being supplied with the predecoded signal X2 of the "L" level, the separation instructing signal STA is at the "L" level. Meanwhile, in the SB generating circuit 82 being supplied with the predecoded signal X1, the separation STB signal of the "H" level is generated. Accordingly, in the SB generating circuit 82, the transistor Q11 is turned on to discharge the potential of the node N54, so that the shared sense amplifier control signal SB falls to the "L". The other SC and SD generating circuits still continue to generate the shared sense amplifier control signals SC and SD of the power supply voltage Vcc level as in the SA generating circuit 81.

When the row predecoded signal X1 is applied, selection among sense amplifier bands is made again, so that the sense amplifier activating signal SFU rises to the "H" level in order to activate the sense amplifier band 2a related to the memory block 1a and the sense amplifier activating signal SFL remains at the "L" level. As a result, bit lines at a lower potential are discharged depending on a slight potential difference read out on the bit lines by the selection of a word line. Subsequently, the first and second sense amplifier activating signals SU, $\overline{SU}$ and SL, $\overline{SL}$ are generated in response to the sense amplifier activating signals SFU and SFL. The sense amplifier activating signal SU rises to the "H" level and the second amplifier activating signal $\overline{SU}$ falls to the "L". The sense amplifier activating signal SL and $\overline{SL}$ remain in the same state as the stand-by state.

In the SB generating circuit 82, when the sense amplifier activating signal $\overline{SU}$ falls to the "L", the transistor Q34 is turned on and the transistor Q26 is turned off, and therefore the separation instructing signal STB is at the "H" level, so that a potential of a node N59 rises to the "H" level, whereby the boost instructing signal SPA of the "H" level is transmitted to the circuit block 813 of the SA generating circuit 81.

In the circuit block 813 of the SA generating circuit 81, in response to the boost instructing signal SPA potentials of the nodes N56 and N57 rise from the power supply voltage Vcc level up to the boosted level of Vcc+α due to the bootstrap effect of the capacitances C20 and C21.

The node N57 is normally charged to a voltage lower than the power supply voltage Vcc by a threshold voltage Vth of the transistor Q18 through the transistor Q18. In addition, since the control signal RAS rises to the "H" level in response to the semiconductor memory device being brought into the operation state, a potential of the node N58 is boosted to a potential level higher than the power supply voltage Vcc by the bootstrap effect of the capacitance 22. As a result, the node N57 is charged to the power supply voltage Vcc level through the transistor Q19.

Meanwhile, since the potential of the node N58 is transmitted to the gate of the transistor Q15, the power supply voltage level on the signal line SA is transmitted to one conduction terminal of the transistor Q16 through the transistor Q15 and then transmitted to the node N56. Accordingly, the potential level of the node N56 is normally held at a level approximate to the power supply voltage Vcc.

When the sense amplifier activating signal SU is generated and rises to the "H" level to turn on the transistor Q21, the potential level of the node N58 attains the "L" level. As a result, the transistors Q19 and Q15 are turned off, the node N56 enters a floating state and the node N57 is connected to the power supply voltage Vcc through the diode-connected transistor Q18. When the sense amplifier activating signals SU and $\overline{SU}$ are generated and the boost instructing signal SPA is subsequently generated, the potentials of the nodes N56 and N57 are boosted to a voltage level of Vcc+β higher than the power supply voltage Vcc through the capacitances C20 and C21 due to the bootstrap effect thereof. The boosted voltage level of the node N57 is transmitted onto the signal line SA through the transistor Q17, whereby the shared sense amplifier control signal SA is boosted to the voltage level of Vcc+α higher than the power supply voltage Vcc. Because the transistor Q18 is diode-connected, the boosted voltage level of the node N57 can be maintained without affecting the power supply voltage Vcc.

As shown in FIGS. 11C and 11D, in the SC generating circuit and the SD generating circuit, the sense amplifier activating signals SL and $\overline{SL}$ remain as in the stand-by state, none of the boost instructing signals SC and SD is generated, and the separation instructing signals STC and STD remain at the "L" level as in the stand-by state. Accordingly, the shared sense amplifier control signals SC and SD remain in the stand-by state of the power supply voltage Vcc level.

After the sensing operation, when potentials on a bit line pair are established at the power supply voltage Vcc and the ground voltage Vss and then rewriting or writing of data is performed to complete the memory cycle, the control signal $\overline{RAS}$ rises to the "H" level. In response thereto, the sense amplifier activating signals SU, $\overline{SU}$, SL and $\overline{SL}$ return to the same state as the stand-by state. In the circuit block 813, the transistor Q20 is turned on, the node N18 is set to the power supply voltage Vcc level and the node N57 is accordingly set to the power supply voltage Vcc level through the transistor Q19. Similarly, the control signal line SA is supplied with the power supply voltage Vcc through the transistor Q9 by the function of the circuit block 810 to maintain the power supply voltage Vcc level. The power supply voltage level on the control signal line SA is transmitted to the node N56 through the transistors Q15 and Q16 and the potential level of the node N57 also attains the power supply voltage Vcc. As a result, all the shared sense amplifier control signals SA-SD return to the stand-by state.

Figure 13:
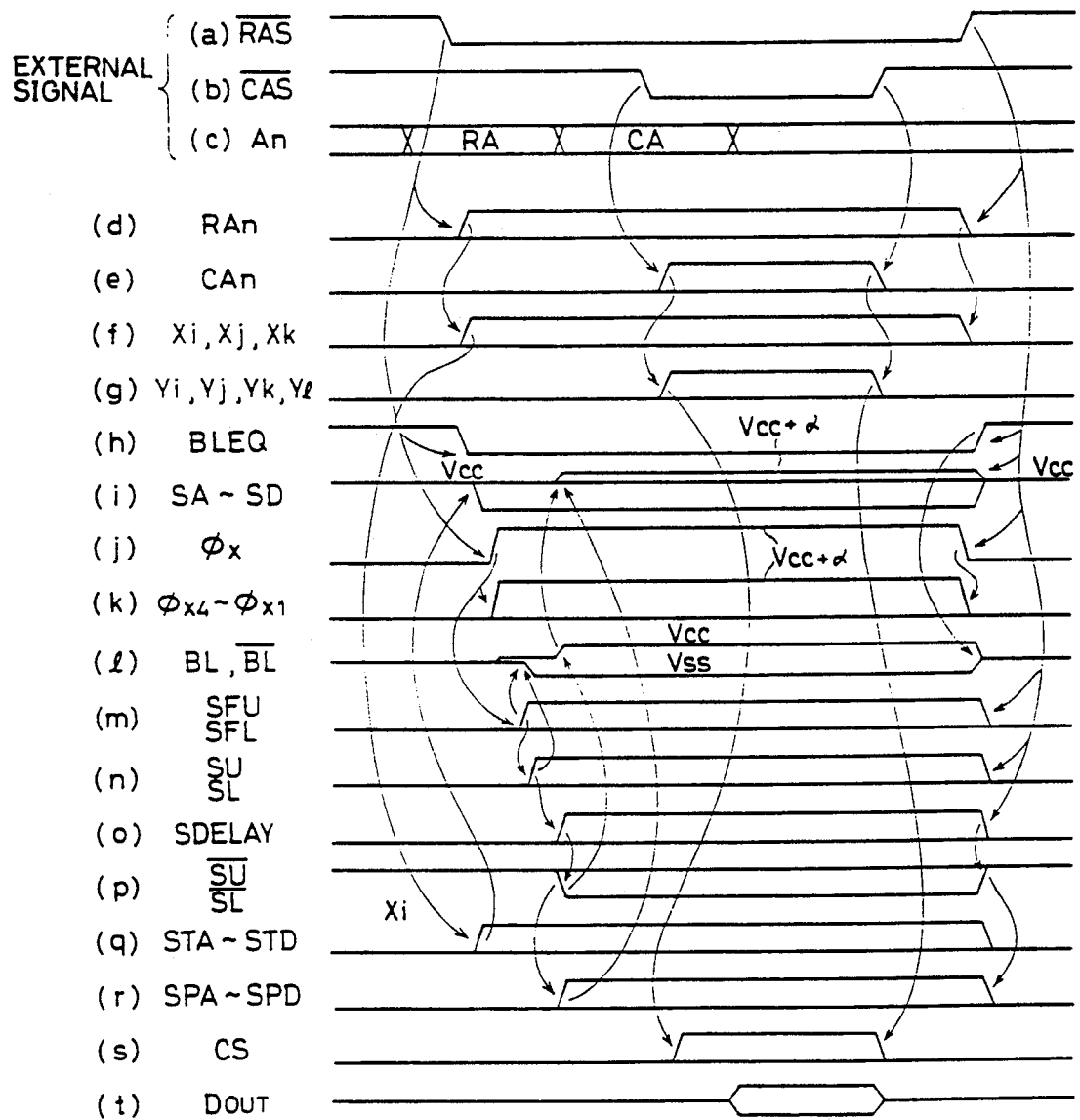
FIG. 13 is a signal waveform diagram showing operations of a dynamic type semiconductor memory device using the shared sense amplifier control signal according to the present invention in a reading operation cycle.

FIG. 13 is the signal waveform diagram showing operation in the data reading cycle in detail. FIG. 13 shows the common operation waveform diagram without specifying selected memory cell block. The data reading operation will be described with reference to FIG. 13 in the following.

When the semiconductor memory device is in the stand-by state, both of the control signals $\overline{RAS}$ and $\overline{CAS}$ are at the "H" level. In a stand-by state wherein the control signal $\overline{RAS}$ is at the "H" level, the precharging/equalizing signal BLEQ is at the "H" level, and each bit line is precharged to a predetermined potential $V_{BL}$.

Then, when the control signal $\overline{RAS}$ falls to the "L" level, the semiconductor memory device is brought into the operation state to start one memory cycle. In response to transition of the control signal $\overline{RAS}$ to the "L" level, the equalizing signal BLEQ falls to the "L" level, so that each bit line pair becomes electrically floated.

On the other hand, the externally applied address signal An (A0-A8) is strobed as the row address RA into the device to generate an internal row address signal RAn. The generated internal row address is predecoded by the predecoding circuit to generate the predecoded signals Xy, Xj and Xk.

Furthermore, when the control signal $\overline{RAS}$ falls to the "L" level, the word line driving master signal $\phi x$ is generated after the lapse of a predetermined delay time period and rises to the "H" level. The $\phi x$ subdecoder 12, in response to the internal row address signal and the word line driving master signal $\phi x$, generates word line sub-decoded signal $\phi x1-\phi x4$. One of the word line sub-decoded signal $\phi x1-\phi x4$ rises to the "H" level.

Meanwhile, before the rise of the selected word line potential, the separation instructing signals STA-STD are generated in response to the predecoded signal Xi. When the memory block 1a is selected, the separation instructing signal STB rises to the "H" level and the separation instructing signals STA, STC and STD are maintained at "L" level. As a result, the shared sense amplifier control signal SB falls to the "L" level, so that the memory block 1b is separated from the sense amplifiers. On this occasion, the other shared sense amplifier control signals SA, SC and SD remain at the power supply voltage Vcc level.

Subsequently, one word line is selected by a combination of the word line sub-decoded signal $\phi x1-\phi x4$ and the internal predecoded signals Xi, Xj and Xk, so that the selected word line potential rises to a level (Vcc + $\alpha$) higher than the power supply voltage Vcc. As a result, the signal charges stored in the memory cells connected to the selected word line WL are transmitted onto the bit lines, causing signal potential change in each bit line pair of BL and $\overline{BL}$.

Subsequently to the occurrence of the signal potential difference on the bit line pair, the sense amplifier activating signals SFU and SU are sequentially generated in response to the predecoded signal Xi and the word line driving master signal $\phi x$. As a result, the bit line potential of the lower potential is discharged down to the ground potential Vss level. Subsequently, the delay activating signal Sdelay obtained by delaying the sense amplifier activating signal SU by a predetermined time period is generated and in response to the sense amplifier activating signal $\overline{SU}$ is generated. In response to the second sense amplifier activating signal $\overline{SU}$, the bit line potential of the higher potential is charged up to the power supply voltage Vcc level. On this occasion, the sense amplifier activating signals SFL, SL and $\overline{SL}$ remain in the same state as the stand-by state.

When the second sense amplifier activating signal $\overline{SU}$ is generated, the boost instructing signal SPA related to the memory block 1a among the boost instructing signals SPA-SPD is correspondingly generated. As a result, a level of the shared sense amplifier control signal SA is boosted to a level of Vcc + $\alpha$ higher than the power supply voltage. The bit line can be charged up to the full power supply voltage Vcc level by the boosted control signal SA.

Subsequently, the control signal $\overline{CAS}$ falls to the "L" level, an internal column signal CAS is generated and the column predecoded signals Yi, Yj, Yk and Yl are generated. The predecoded signal causes the column decoder to generate the column selecting signal CS, so that the selected 4-bit data is transmitted onto the I/O bus 40. Subsequently, one bit is selected among 4 bits by the I/O decoder 17 and is outputted as output data $D_{OUT}$ through the output buffer 22.

During the reading operation, the word line potential is at the boosted level of Vcc + $\alpha$ and the bit line potential is maintained at the power supply voltage Vcc level. As a result, the voltage of the power supply voltage Vcc level is rewritten in the selected memory cells (all the memory cells connected to the selected word line) without a signal loss due to a threshold voltage of a switching element connecting the bit line and the sense amplifier. Therefore, it becomes possible to restore the sufficient signal charges in the memory cells.

After the rewriting, the control signal $\overline{CAS}$, and subsequently the control signal $\overline{RAS}$ rise to the "H" level to complete one memory cell cycle, whereby the semiconductor memory device returns to the stand-by state again.

In the above described embodiments, the description is made of an arrangement wherein the sense amplifier is disposed at the central portion of the divided memory cell array and shared between two cell blocks. However, the arrangement according to the present invention can be applied to the alternate arrangement type shared sense amplifier as disclosed by Arimoto et al. in "I·E·E·E Journal of Solid-State Circuits", No. 5 volume 24, October, 1989, pp. 1184-1190.

Figure 14:
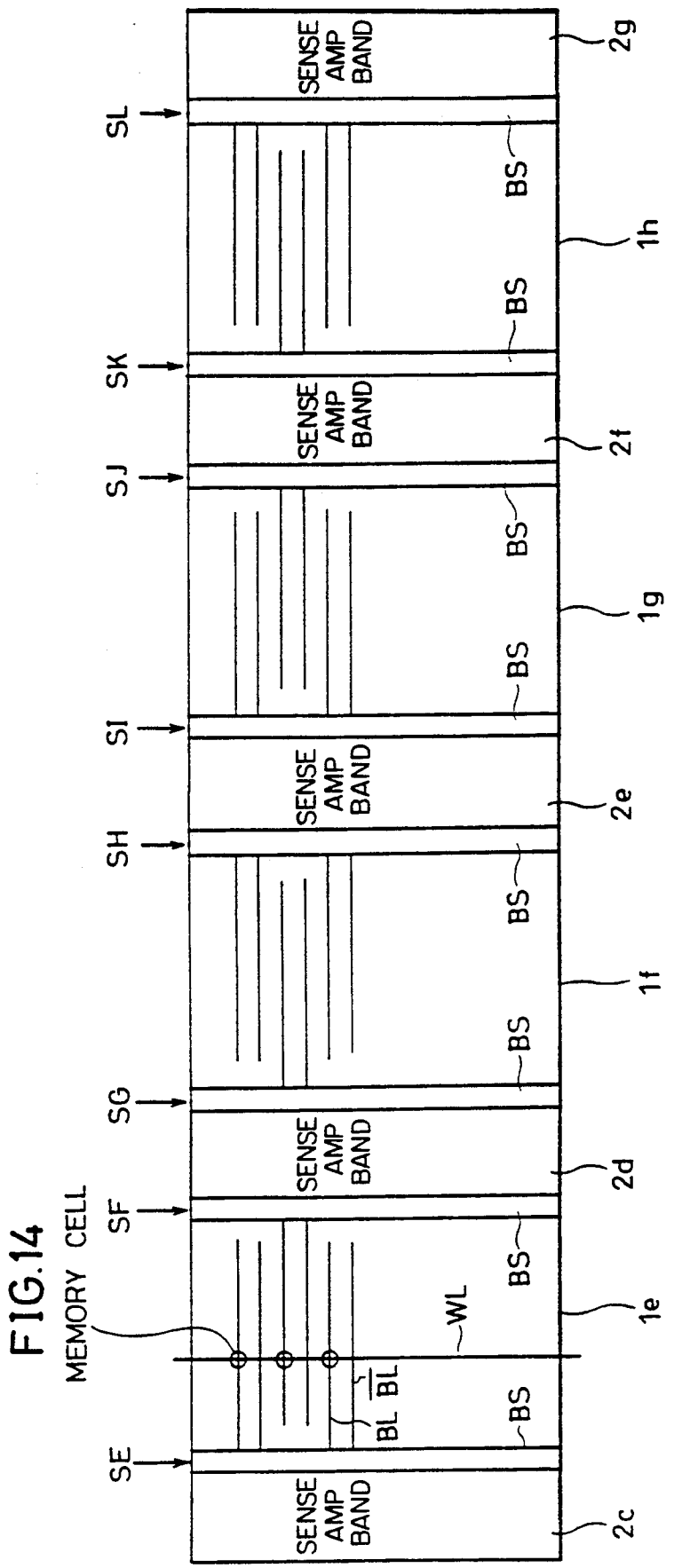
FIG. 14 is a diagram showing a schematic arrangement of a memory cell array of a semiconductor memory device of an alternate arrangement type shared sense amplifier scheme according to another embodiment of the present invention.

FIG. 14 is the diagram schematically showing an arrangement of a memory cell array where the shared sense amplifier control signal according to the present invention is applied to the memory device of the alternate arrangement type shared sense amplifier. In FIG. 14, the memory cell array is divided into four cell blocks of 1e, 1f, 1g and 1h. Two sense amplifier bands are provided for each of the blocks 1e-1h. More specifically, sense amplifier bands 2c and 2d are provide for the block 1e. Sense amplifier bands 2d and 2e are provided for the block 1f, sense amplifier bands 2e and 2f are provided for the block 1g and the sense amplifier bands 2f and 2g are provided for the cell block 1h.

The sense amplifier band 2c senses and amplifies signal potentials of odd numbered columns of the cell block 1e. The sense amplifier band 2d senses and amplifies signals on even-numbered columns of the cell blocks 1e and 1f. The sense amplifier band 2e senses and amplifies signal potentials on odd-numbered columns of the cell blocks 1f and 1g. The sense amplifier band 2f senses and amplifies signal potentials on even-numbered columns of the blocks 1g and 1h. The sense amplifier band 2g senses and amplifies signal potentials on odd-numbered columns of the cell block 1h.

In the alternate arrangement type sense amplifier arrangement shown in FIG. 14, the sense amplifier bands for sensing signal potentials of even-numbered columns and the sense amplifier bands for sensing and amplifying signal potentials on even-numbered columns are alternately arranged in the memory array.

Bit line selecting switches Bs each for selectively connecting a sense amplifier and each column are disposed between respective sense amplifier bands 2c-2g and respective cell blocks 1e-1h. Selecting switches BS are supplied with correspondingly shared sense amplifier control signals SE–SL.

In the memory device of the alternate arrangement type sense amplifier arrangement shown in FIG. 14, only the sense amplifiers provided at the opposite sides of the block selected in response to the block designating signal (a part of the row address signal) are activated to sense and amplify a signal potential difference between bit lines of each bit line pair. For example, when the cell block 1f is selected, the sense amplifier band 2d is separated from the cell block 1e and connected to the cell block 1f, and the sense amplifier band 2e is separated from the cell block 1g and connected to the cell block 1f.

In the arrangement shown in FIG. 14 according to the arrangement of the present invention, when the memory cells in the block 1f are selected, the shared sense amplifier control signals SF and SI shift to the "L" level, that is, the ground potential Vss level, in order to separate the cell blocks 1e and 1c from the sense amplifier bands 2d and 2e, respectively. The shared sense amplifier control signals SE, SJ, SK and SL remain at the power supply voltage Vcc level in the stand-by state. Then, the shared sense amplifier control signal SG and SH related to the selected memory block 1f are boosted to a level of Vcc+α higher than the power supply voltage Vcc while the sense amplifiers included in the sense amplifier bands 2d and 2e are activated. On this occasion, the memory cell blocks 1e, 1g and 1h and the sense amplifiers included in the sense amplifier bands 2c, 2f and 2g remain in the stand-by state.

Accordingly, also with the arrangement shown in FIG. 14, by boosting the shared sense amplifier control signal for connecting the sense amplifiers to be activated with the cell block including the selected memory cells to the level of Vcc+α higher than the power supply voltage, sufficient signal charges can be written or rewritten in the memory cells without a signal loss.

While in the above described embodiments, the description is made of one example in which a switching element for connecting a bit line and a sense amplifier comprises an n MIS transistor, the connection switch may be comprised of a p MIS transistor if polarity of the shared sense amplifier control signal is changed.

As in the foregoing, according to the present invention, in the semiconductor memory device of the shared sense amplifier arrangement, when the memory device is in the stand-by state the shared sense amplifier control signal is maintained at a reference voltage level, and in the operation state, only a shared sense amplifier control signal related to the selected memory cell block is set to a first level different from the reference voltage to render the connection switch to be deeply turned on when the sense amplifiers are driven. As a result, it is possible to write the sufficient amount of electric charges in the memory cells without a signal loss in the writing or rewriting of the memory cells. In addition, since the first level is maintained for only a short time period of the sense amplifier operating period, even if small amount of leak currents are generated in the control signal line, it is possible to assure a sufficient margin for the leak currents in the shared sense amplifier control signal line in the memory device, allowing a highly reliable and stable operation to be performed, so that semiconductor memory device having excellent performance and production yield can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor memory device including a memory cell array having a plurality of memory cells arranged in a matrix of rows and columns and a plurality of memory blocks each including several said rows, a plurality of sense amplifiers provided corresponding to said columns and each shared between two memory blocks for sensing and amplifying signal potentials on the related columns, and connecting means for connecting said sense amplifiers to the related memory blocks, said connecting means operable in a normal conduction mode in response to a first voltage level and in an enhanced conduction mode in response to a second voltage level, said connecting means being more conductive when operated in said enhanced condition mode than when operated in said normal conduction mode, a circuit for controlling an operation of said connecting means, comprising:

first circuit means responsive to an externally applied operation cycle defining signal, a signal for activating said sense amplifiers and a block designating signal, for generating a connection instructing signal for selectively connecting each of said sense amplifiers to the corresponding columns of the related two memory blocks or to the corresponding column of one memory block of said two memory blocks, said first circuit means including:
second circuit means responsive to said operation cycle defining signal being in an inactive state indicating a stand-by state of said semiconductor memory device, for generating a signal of the first voltage level and applying the same to said connecting means to connect each of said sense amplifiers to the corresponding columns of both the related two blocks, and third circuit means, when said operation cycle defining signal is in an active state indicating an operation state of said semiconductor memory device, responsive to said block designating signal and said sense amplifier activating signal for generating a control signal of said second voltage level different from said first voltage and applying the same to said connecting means, thereby operating said connecting means in said enhanced mode and connecting only the respective columns of the block designated by said block designating signal among the two memory blocks related to the sense amplifiers to which said sense amplifier activating signal is transmitted.

2. A circuit according to claim 1, wherein said third circuit means includes fourth circuit means responsive to said active state of said operation cycle defining signal and said block designating signal for supplying to said connecting means a separation instructing signal for separating non-selected blocks from said sense amplifiers to which said sense amplifier activating signal is transmitted, said separation instructing signal being generated prior to said sense amplifier activating signal.

3. A circuit according to claim 1, wherein said semiconductor memory device comprises circuit means responsive to said operation cycle defining signal and said block designating signal for generating said sense amplifier activating signal, said sense amplifier activating signal being transmitted only to the sense amplifiers related to the selected memory block designated by said block designating signal among said plurality of memory blocks, and wherein said third circuit means includes:

fourth circuit means responsive to said active state of said operation cycle defining signal and said block designating signal for applying said signal of the first voltage level to the related connecting means such that both the non-selected memory blocks are connected to the related sense amplifiers, when both blocks of paired memory blocks are non-selected, fifth circuit means responsive to said active state of said operation cycle defining signal and said block designating signal for applying said signal of the first voltage level to connecting means connecting the selected memory block to the related sense amplifier and applying the separation instructing signal to connecting means connecting non-selected memory block paired with said selected memory block to the related sense amplifiers, and sixth circuit means responsive to said sense amplifier activating signal for shifting to said second voltage level a signal level applied to said connecting means connecting said selected memory block to the related sense amplifiers.

4. A semiconductor memory device, comprising:

a plurality of memory blocks each having a plurality of memory cells arranged in matrix of rows and columns, said plurality of memory blocks including at least first to fourth memory block, a first sense amplifier band shared between said first and second memory blocks, said first sense amplifier band including a plurality of sense amplifiers each shared between the corresponding columns of said first and second memory blocks and sensing and amplifying signal potentials on the corresponding columns, first connecting means for connecting said first memory block and said first sense amplifier band, said first connecting means including switching elements provided between the respective columns of said first memory block and the corresponding sense amplifiers, second connecting means for connecting said second memory block and said first sense amplifier band, said second connecting means including switching elements provided between the respective columns of said second memory block and the corresponding sense amplifiers, a second sense amplifier band shared between said third memory block and said fourth memory block, said second sense amplifier band including a plurality of sense amplifiers each shared between a column of said third memory block and a column of said fourth memory block, third connecting means for connecting said third memory block and said second sense amplifier band, said third connecting means including switching elements for connecting the respective columns of said third memory block and the corresponding sense amplifiers, fourth connecting means for connecting said fourth memory block and said second sense amplifier band, said fourth connecting means including switching elements for connecting the respective columns of said fourth memory block and the corresponding sense amplifiers, means responsive to an externally applied operation cycle defining signal and an externally applied block designating signal for generating a sense amplifier activating signal, said sense amplifier activating signal activating only sense amplifiers in a sense amplifier band provided corresponding to the memory block designated by said block designating signal, first signal generating means responsive to an inactive state of said operation cycle defining signal for applying a connection instructing signal of a reference voltage level to said first through fourth connecting means, second signal generating means responsive to an active state of said operation cycle defining signal and said block designating signal for applying a separation instructing signal to the connecting means such that the memory block pairing with the memory block designated by said block designating signal is separated from the related sense amplifier band, third signal generating means responsive to said operation cycle defining signal, said block designating signal and said sense amplifier activating signal for applying a signal of a first potential level different from said reference voltage to the connecting means corresponding to the memory block designated by said block designating signal, said first potential causing said switching elements to enter into an on state deeper than that by said reference voltage, and fourth signal generating means responsive to the active state of said operation cycle defining signal and said block designating signal for applying said signal of the reference voltage level to the connecting means corresponding to the memory block which is not paired with the memory block designated by said block designating signal.

5. A semiconductor memory device, comprising:

a plurality of memory blocks each having a plurality of memory cells arranged in a matrix of rows and columns, said plurality of memory blocks including at least first through fourth memory blocks, a first sense amplifier band shared between said first and second memory blocks, said first sense amplifier band including a plurality of sense amplifiers each shared between a column of said first memory block and a column of the second memory block and sensing and amplifying signal potentials on the corresponding columns, first connecting means for connecting said first memory block and said first sense amplifier band, said first connecting means including switching elements provided between the respective columns of said first memory block and the corresponding sense amplifiers, second connecting means for connecting said second memory block and said first sense amplifier band, said second connecting means including switching elements provided between the respective columns of said second memory block and the corresponding sense amplifiers, a second sense amplifier band shared between said third memory block and said fourth memory block, said second sense amplifier band including a plurality of sense amplifiers each shared between each column of said third memory block and each column of said fourth memory block, third connecting means for connecting said third memory block and said second sense amplifier band, said third connecting means including switching elements for connecting the respective columns of said third memory block and the corresponding sense amplifiers, fourth connecting means for connecting said fourth memory block and said second sense amplifier band, said fourth connecting means including switching elements for connecting the respective columns of said fourth memory block and the corresponding sense amplifiers, means responsive to an externally applied operation cycle defining signal and an externally applied block designating signal for generating a sense amplifier activating signal, said sense amplifier activating signal activating only the sense amplifier band corresponding to the memory block designated by said block designating signal, and a first control circuit for controlling operation of said first connecting means, said first control circuit including:
first circuit means responsive to an inactive state of said externally applied operation cycle defining signal for applying a first control signal of a reference voltage level to said first connecting means, second circuit means responsive to an active state of said operation cycle defining signal and said block designating signal for generating a first separation instructing signal, third circuit means responsive to a second separation instructing signal for causing a level of said first control signal to shift to a first potential level at which said first connecting means is turned off, fourth circuit means responsive to said block designating signal and said sense amplifier activating signal for generating a first shift designating signal, and fifth circuit means responsive to a second shift instructing signal for shifting said first control signal to a second potential level, said second potential level causing said switching elements of said first connecting means to enter into an on state deeper than that by said reference voltage, a second control circuit means for controlling operation of said second connecting means, said second control circuit means including:
circuit means responsive to the inactive state of said externally applied operation cycle defining signal for applying a second control signal of a reference voltage level to said second connecting means, circuit means responsive to the active state of said operation cycle defining signal and said block designating signal for generating said second separation instructing signal, circuit means responsive to said first separation instructing signal for causing a level of said second control signal to shift to the first potential level at which said second connecting means is turned off, circuit means responsive to said block designating signal and said sense amplifier activating signal for generating said second shift instructing signal, and circuit means responsive to said first shift instructing signal for shifting the level of said second control signal to the second potential level, said second potential level causing said switching elements of said first connecting means to shift to an on state deeper than that by said reference voltage, a third control circuit for controlling operation of said third connecting means, said third control circuit including:
circuit means responsive to the inactive state of said externally applied operation cycle defining signal for applying a third control signal of the reference voltage level to said third connecting means, circuit means responsive to the active state of said operation cycle defining signal and said block designating signal for generating a third separation instructing signal, circuit means responsive to a fourth separation instructing signal for shifting a level of said third control signal to the first potential level at which said third connecting means is turned off, circuit means responsive to said block designating signal and sense amplifier activating signal for generating a third shift instructing signal, and circuit means responsive to a fourth shift instructing signal for shifting the level of said third control signal to the second potential level, said second potential level causing said switching elements of said third connecting means to shift to an on state deeper than that by said reference voltage, and a fourth control circuit for controlling operation of said fourth connecting means, said fourth control circuit including:
circuit means responsive to the inactive state of said externally applied operation cycle defining signal for applying a fourth control signal of the reference voltage level to said fourth connecting means, circuit means responsive to the active state of said operation cycle defining signal and said block designating signal for generating said third separation instructing signal, circuit means responsive to said third separation instructing signal for shifting a level of said fourth control signal to the first potential level at which said fourth connecting means is turned off, circuit means responsive to said block designating signal and said sense amplifier activating signal for generating said fourth shift instructing signal, and circuit means responsive to said third shift instructing signal for shifting the level of said fourth control signal to the second potential level, said second potential level causing said switching elements of said first connecting means to shift to an on state deeper than that by said reference voltage.

6. In a semiconductor memory device including a memory cell array having a plurality of memory cells arranged in a matrix of rows and columns and a plurality of memory blocks divided on a plural row basis, a plurality of sense amplifiers provided corresponding to said columns and each shared between two memory blocks for sensing and amplifying signal potentials on the related columns, and connecting means for connecting said amplifiers to the related memory blocks, a method of driving a circuit for controlling operation of said connecting means, said control circuit including circuit means responsive to an externally applied operation cycle defining signal, a signal for activating said sense amplifiers and a block designating signal for selectively connecting each of said amplifiers to the corresponding columns of the related two memory blocks or the corresponding column of one of said two memory blocks, a method comprising the steps of:

a first step of, in response to said operation cycle defining signal being in an inactive state indicating a stand-by state of said semiconductor memory device, generating a signal of a reference voltage level and applying the same to said connecting means to connect each of said sense amplifiers to the corresponding columns of both the related two memory blocks, a second step of, when said operation cycle defining signal is in an active state indicating an operation state of said semiconductor memory device, generating a control signal of a first voltage level different from said reference voltage and applying the same to said connecting means in response to said block designating signal and said sense amplifier activating signal, thereby connecting only the respective columns of the one memory block designated by said block designating signal to the corresponding sense amplifiers among the memory blocks related to the sense amplifiers to which said sense amplifier activating signal is transmitted, said first voltage level causing said connecting means to shift to an on state deeper than that by said reference voltage.

7. A method according to claim 6, wherein said second step includes applying to said connecting means a separation instructing signal for separating non-selected block from said sense amplifiers to which said sense amplifier activating signal is transmitted in response to said active state of said operation cycle defining signal and said block designating signal, said separation instructing signal being generated prior to said sense amplifier activating signal.

8. A method according to claim 6, wherein said semiconductor memory device comprises circuit means responsive to said operation cycle defining signal and said block designating signal for generating said sense amplifier activating signal, said sense amplifier activating signal being transmitted only to the sense amplifier related to the selected memory block designated by said block designating signal among said plurality of memory blocks, and said second step comprises:

a third step of, when both of the paired memory blocks are non-selected, applying said signal of the reference voltage level to the related connecting means such that both the non-selected memory blocks are connected to the related sense amplifiers, in response to said active state of said operation cycle defining signal and said block designating signal, a fourth step of, in response to said active state of said operation cycle defining signal and said block designating signal, applying said signal of the reference voltage level to the connecting means for connecting the selected memory block to the related sense amplifiers and applying the separation instructing signal to the connecting means for connecting non-selected memory block paired with said selected memory block to the related sense amplifiers, and a fifth step of shifting to said first potential level a signal level applied to the connecting means for connecting said selected memory block to the related sense amplifiers in response to said sense amplifier activating signal.

9. A semiconductor memory device, comprising:

a plurality of memory blocks (1a-1d) each having a plurality of memory cells arranged in a matrix of rows and columns, said plurality of memory blocks including at least first through fourth memory blocks (1a-1d), a first sense amplifier band shared between first and second memory blocks (1a, 1b) of said plurality of memory blocks, said first sense amplifier band including a plurality of sense amplifiers each shared between a column of said first memory block and a column of the second memory block and sensing and amplifying signal potentials on the corresponding columns, first connecting means (BSAs) for connecting said first memory block and said first sense amplifier band, said first connecting means including switching elements (BSA) provided between the respective columns of said first memory block (1a) and the corresponding sense amplifiers, second connecting means (BSBs) for connecting said second memory block and said first sense amplifier band, said second connecting means including switching elements (BSB) provided between the respective columns of said second memory block (1b) and the corresponding sense amplifiers, a second sense amplifier band shared between third and fourth memory block (1c, 1d)) of said plurality of memory blocks, said second sense amplifier band including a plurality of sense amplifiers each shared between each column of said third memory block and each column of said fourth memory block, third connecting means (BSCs) for connecting said third memory block (1c) and said second sense amplifier band, said third connecting means including switching elements (BSC) for connecting the respective columns of said third memory block (1c) and the corresponding sense amplifiers, fourth connecting means (BSDs) for connecting said fourth memory block (1d) and said second sense amplifier band, said fourth connecting means including switching elements (BSD) for connecting the respective columns of said fourth memory block (1d) and the corresponding sense amplifiers, means (23) responsive to an operation cycle defining signal and a memory block designating signal (x1-x4) for generating a sense amplifier activating signal (ISU), said sense amplifier activating signal activating only the sense amplifier band corresponding to the memory block designated by said memory block designating signal, and a first connecting circuit (81) for controlling operation of said first connecting means, said first control circuit including:
- first circuit means (810, C11, Q10) responsive to said operation cycle defining signal for applying a first control signal (SA) of a reference voltage level to said first connecting means,
- second circuit means (Q22–Q23, Q30–Q31) responsive to an active state of said operation cycle defining signal and a second memory block designating signal (x2) for generating a first separation instructing signal (STA),
- third circuit means (Q11, Q13) responsive to the first separation instructing signal for causing a level of said first control signal (SA) to shift to a first potential level at which said first connecting means is turned off,
- fourth circuit means (812) responsive to said second memory block designating signal (x2) and said sense amplifier activating signal (ISU) for generating a first shift instructing signal (SPB), and
- fifth circuit means (813) responsive to a second shift instructing signal (SPA) for shifting said first control signal to a second potential level, said second potential level causing said switching elements of said first connecting means to enter into an on state deeper than that by said reference voltage, a second control circuit means (82) for controlling operation of said second connecting means, said second control circuit means including:
- circuit means (810, Q10, Q11) responsive to the said operation cycle defining signal for applying a second control signal (SB) of a reference voltage level to said second connecting means,
- circuit means (Q22–Q23, Q30–Q31) responsive to a first memory block designating signal (x1) for generating a second separation instructing signal (STB),
- circuit means (Q11, Q13) responsive to said second separation instructing signal for causing a level of said second control signal (SB) to shift to the first potential level at which said second connecting means is turned off,
- circuit means (812) responsive to said first memory block designating signal and said sense amplifier activating signal (ISU) for generating said second shift instructing signal (SPA), and
- circuit means (813) responsive to said first shift instructing signal (SPB) for shifting the level of said second control signal (SB) to the second potential level, said second potential level causing said switching elements of said first connecting means to shift to an on state deeper than that by said reference voltage, a third control circuit (83) for controlling operation of said third connecting means, said third control circuit including:
- circuit means (810, C11, Q10) responsive to said operation cycle defining signal for applying a third control signal (SC) of the reference voltage level to said third connecting means,
- circuit means (Q22–Q23, Q30–Q31) responsive to a fourth memory block designating signal (x4) for generating a third separation instructing signal (STC),
- circuit means (Q11, Q13) responsive to said third separation instructing signal for shifting a level of said third control signal to the first potential level at which said third connecting means is turned off,
- circuit means (812) responsive to said fourth memory block designating signal and sense amplifier activating signal for generating at third shift instructing signal (SPD), and
- circuit means (813) responsive to a fourth shift instructing signal (SPC) for shifting the level of said third control signal to the second potential level, said second potential level causing said switching elements of said third connecting means to shift to an on state deeper than that by said reference voltage, and a fourth control circuit (84) for controlling operating of said fourth connecting means, said fourth control circuit including:
- circuit means (810, Q10, C11) responsive to the operation cycle defining signal for applying a fourth control signal (SD) of the reference voltage level to said fourth connecting means,
- circuit means (Q22–Q23, Q30–31) responsive to a third memory block designating signal (x3) for generating a fourth separation instructing signal (STD),
- circuit means (Q13, Q14) responsive to said fourth separation instructing signal for shifting a level of said fourth control signal (SD) to the first potential level at which said fourth connecting means is turned off,
- circuit means (812) responsive to said third memory block designating signal (x3) and said sense amplifier activating signal (ISL) for generating said fourth shift instructing signal (SPC), and
- circuit means (813) responsive to said third shift instructing signal for shifting the level of said fourth control signal (SD) to the second potential level, said second potential level causing said switching elements of said first connecting means to shift to an on state deeper than that by said reference voltage.

* * * * *